(12) United States Patent
Shichi et al.

(10) Patent No.: US 8,563,944 B2
(45) Date of Patent: *Oct. 22, 2013

(54) ION BEAM DEVICE

(75) Inventors: Hiroyasu Shichi, Tokyo (JP); Shinichi Matsubara, Chofu (JP); Norihide Saho, Tsuchiura (JP); Noriaki Arai, Hitachinaka (JP); Tohru Ishitani, Sayama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/595,588

(22) Filed: Aug. 27, 2012

(65) Prior Publication Data
US 2012/0319003 A1 Dec. 20, 2012

Related U.S. Application Data

(63) Continuation of application No. 13/144,620, filed as application No. PCT/JP2010/000086 on Jan. 8, 2010, now Pat. No. 8,263,943.

(30) Foreign Application Priority Data

Jan. 15, 2009 (JP) ................. 2009-006306

(51) Int. Cl.
*H01J 49/10* (2006.01)
*H01J 37/28* (2006.01)

(52) U.S. Cl.
USPC ............ 250/423 F; 250/423 R; 250/492.21; 250/492.3; 250/493.1; 250/396 R; 250/398; 315/111.81; 315/111.31

(58) Field of Classification Search
USPC .......... 250/423 F, 423 R, 396 R, 398, 492.21, 250/492.3, 493.1; 315/111.81, 111.31
See application file for complete search history.

(56) References Cited

U.S. PATENT DOCUMENTS

| 4,644,205 A | 2/1987 | Sudo et al. |
| 6,538,254 B1 | 3/2003 | Tomimatsu et al. |

(Continued)

FOREIGN PATENT DOCUMENTS

| JP | 58-85242 A | 5/1983 |
| JP | 61-250928 A | 11/1986 |

(Continued)

OTHER PUBLICATIONS

Hong-Shi Kuo et al., Preparation and Characterization of Single-Atom Tips, Nano Letters, vol. 4, No. 12, Nov. 2004, pp. 2379-2382.

(Continued)

*Primary Examiner* — Nikita Wells
(74) *Attorney, Agent, or Firm* — Mattingly & Malur, PC

(57) ABSTRACT

Provided is an ion beam device provided with a gas electric field ionization ion source which can prevent an emitter tip from vibrating in a non-contact manner. The gas electric field ionization ion source is comprised of an emitter tip (21) for generating ions; an emitter base mount (64) for supporting the emitter tip; an ionizing chamber which has an extraction electrode (24) opposed to the emitter tip and which is configured so as to surround the emitter tip (21); and a gas supply tube (25) for supplying gas to the vicinity of the emitter tip. The emitter base mount and a vacuum container magnetically interact with each other.

5 Claims, 13 Drawing Sheets

(56) References Cited

U.S. PATENT DOCUMENTS

| | | |
|---|---|---|
| 7,138,628 B2 | 11/2006 | Tomimatsu et al. |
| 7,851,768 B2 * | 12/2010 | Frosien ............... 250/423 F |
| 7,939,800 B2 | 5/2011 | Frosien |
| 8,044,370 B2 * | 10/2011 | Winkler et al. ........... 250/423 F |
| 8,115,184 B2 | 2/2012 | Shichi et al. |
| 8,263,943 B2 * | 9/2012 | Shichi et al. ............. 250/423 R |
| 2002/0050565 A1 | 5/2002 | Tokuda et al. |
| 2008/0067396 A1 | 3/2008 | Ohshima et al. |
| 2008/0142702 A1 | 6/2008 | Frosien et al. |
| 2008/0217555 A1 | 9/2008 | Ward et al. |
| 2009/0152462 A1 | 6/2009 | Ishitani et al. |
| 2009/0173888 A1 | 7/2009 | Shichi et al. |
| 2011/0147609 A1 * | 6/2011 | Shichi et al. ................ 250/400 |

FOREIGN PATENT DOCUMENTS

| | | |
|---|---|---|
| JP | 63-78440 A | 4/1988 |
| JP | 1-176635 A | 7/1989 |
| JP | 4-286843 A | 10/1992 |
| JP | 7-282759 A | 10/1995 |
| JP | 2001-167999 A | 6/2001 |
| JP | 2002-150990 A | 5/2002 |
| JP | 2003-123569 A | 4/2003 |
| JP | 2007-311117 A | 11/2007 |
| JP | 2009-163981 A | 7/2009 |
| WO | 99/05506 A1 | 2/1999 |
| WO | 2005/124815 A1 | 12/2005 |
| WO | 2009/147894 A1 | 12/2009 |

OTHER PUBLICATIONS

John Morgan et al., An Introduction to the Helium Ion Microscope, Microscopy Today, vol. 14, No. 4, Jul. 2006, pp. 24-31.

\* cited by examiner

ION BEAM DEVICE

This application is a continuation of U.S. patent application Ser. No. 13/144,620, filed Jul. 14, 2011, now U.S. Pat. No. 8,263,943.

TECHNICAL FIELD

The present invention relates to an ion beam device such as an ion microscope or an ion beam machining device, a composite device of an ion beam machining device and an ion microscope, and a composite device of an ion microscope and an electron microscope. The invention also relates to an analysis/inspection device to which an ion microscope and an electron microscope are applied.

BACKGROUND ART

When a sample is irradiated while scanning with electrons and secondary charged particles released from the sample are detected, the structure of the surface of the sample can be observed. This is called a scanning electron microscope (hereinbelow, abbreviated as SEM). On the other hand, also by irradiating a sample while scanning with an ion beam and detecting secondary charged particles released from the sample, the structure of the sample surface can be observed. This is called a scanning ion microscope (hereinbelow, abbreviated as SIM). Particularly, when a sample is irradiated with an ion species which is light in mass such as hydrogen or helium, sputtering action becomes relatively small, and it becomes suitable to observe a sample.

Further, the ion beam is more sensitive to information of a sample surface as compared with an electron beam. The reason is that an excitation region of secondary charged particles locally exists more in the sample surface as compared with irradiation of the electron beam. In the electron beam, since the nature as waves of electrons cannot be ignored, an aberration is caused by the diffractive effect. On the other hand, since the ion beam is heavier than electrons, the diffractive effect can be ignored.

By irradiating a sample with an ion beam and detecting ions passed through the sample, information in which the structure of the inside of the sample can also be obtained. This is called a transmission ion microscope. In particular, by irradiating a sample with an ion species which is light in mass such as hydrogen or helium, the ratio of passing through the sample increases, and it is preferable for observation.

On the other hand, by irradiating a sample with an ion species which is heavy in mass such as argon, xenon, or gallium, it is preferable to process the sample by sputtering action. In particular, a focused ion beam (hereinbelow, abbreviated as FIB) device using a liquid metal ion source (hereinbelow, abbreviated as LMIS) is known as an ion beam processor. In recent years, a composite FIB-SEM device of a scanning electron microscope (SEM) and a focused ion beam (FIB) is also used. In the FIB-SEM device, by forming a square hole in a desired place with irradiation of an FIB, a section can be SEM-observed. A sample can also be processed by generating a gas ion of argon, xenon, or the like by a plasma ion source or a gas field ion source and irradiating a sample with the gas ion.

In the ion microscope, a gas field ion source is preferable as the ion source. The gas field ion source supplies gas of hydrogen, helium, or the like to a metal emitter tip having a tip curvature radius of about 100 nm, applies a high voltage of a few kV or higher to the emitter tip to ionize gas molecules, and extracts the resultant as an ion beam. As characteristics, the ion source can generate an ion beam having a narrow energy width and, since the size of the ion generation source is small, generate a fine ion beam.

In the ion microscope, to observe a sample at a high signal-noise ratio, an ion beam of high current density has to be obtained on a sample. For this purpose, the ion radiation angle current density of the ionization ion source has to be made high. To make the ion radiation angle current density high, it is sufficient to increase molecule density of ion material gas (ionization gas) in vicinity of the emitter tip. The gas molecular density per unit pressure is inversely proportional to temperature of gas. Consequently, it is sufficient to cool the emitter tip to extremely low temperature and decrease the temperature of gas around the emitter tip to low temperature. By the operation, the molecule density of the ionization gas in the vicinity of the emitter tip can be made high. The pressure of the ionization gas around the emitter tip can be set to, for example, about $10^{-2}$ to 10 Pa.

However, when the pressure of the ion material gas is set to 1 Pa or higher, the ion beam collides with neutral gas, and the ion current decreases. When the number of gas molecules in the field ion source becomes large, the frequency that gas molecules which collide with the wall of a high-temperature vacuum vessel and come to have high temperature collide with the emitter tip increases. Due to this, the temperature of the emitter tip rises, and the ion current decreases. Consequently, the field ion source is provided with an ionization chamber mechanically surrounding the emitter tip. The ionization chamber is formed by using an ion extraction electrode provided so as to be opposed to the emitter tip.

Patent Reference 1 discloses a method of improving the ion source characteristic by forming a small projection at the end of the emitter tip. Non-patent Reference 1 discloses a method of manufacturing the small projection at the end of the emitter tip by using a second metal different from the material of the emitter tip. Non-patent Reference 2 discloses a scanning ion microscope having a gas field ion source for ion-emitting helium.

Patent Reference 2 discloses a method of providing, in positions apart from each other in the circumferential direction of a side wall of a vacuum vessel of an ion source, a plurality of supporting pieces for vibration prevention extending from the inner face of the side wall toward the ion source and whose length can be adjusted from the outside so as to penetrate, and sandwiching a heat insulating material between the inner end of each of the supporting piece and the supporting face to press the ion source, thereby preventing vibration of the ion source. However, inflow of heat from the supporting pieces to the ion source is not considered.

Patent Reference 3 discloses a method of making a spherical device float in a predetermined position over a superconductor material at the time of exposing the sphere device to light.

Patent Reference 4 discloses a liquid metal ion source having a needle-shaped member as an ion emitter, an extraction electrode, and an acceleration electrode, wherein an opening through which an extracted ion passes is provided on the side opposed to the needle-shaped member of the acceleration electrode, and a shield member for preventing sputter particles generated by collision of the extracted ions with each other or with the acceleration electrode from reaching the needle-shaped member is provided.

Patent Reference 5 discloses an electron beam device having a movable diaphragm which can be inserted from a passage of an electron beam, wherein a spare chamber which is communicated with the electron beam device body in vacuum and can be shielded by air lock means, and means for evacuating the spare chamber are provided, and the movable diaphragm is moved to the spare chamber without exposing the electron beam device body to atmosphere, and can be replaced. In the device, without exposing the electron beam device body to atmosphere, the movable diaphragm which is contaminated can be easily replaced or cleaned.

Patent Reference 6 discloses a charged particle beam device which is downsized by using a non-evaporable Getter pump, not an ion pump, as main exhaust means of the electron source.

Patent Reference 7 discloses a gas field ion source provided with a change-over switch for connecting a high-voltage lead-in wire for the extraction electrode to a high-voltage lead-in wire for the emitter tip. In the gas field ion source, after forced discharge process between the ion source outer wall and the emitter tip, that is, so-called conditioning process, discharge between the emitter tip and the extraction electrode can be prevented.

Patent Reference 8 proposes an apparatus for observing and analyzing a failure, a foreign matter, or the like by forming a square hole near an abnormal place in a sample with an FIB and observing the section of the square hole by an SEM device.

Patent Reference 7 proposes a technique of extracting a small sample for transmission electron microscope observation from a bulk sample by using an FIB and a probe.

RELATED-ART DOCUMENTS

Patent Documents

Patent Reference 1: Japanese Unexamined Patent Application Publication No. S58-85242
Patent Reference 2: Japanese Unexamined Patent Application Publication No. H07-282759
Patent Reference 3: Japanese Unexamined Patent Application Publication No. 2001-167999
Patent Reference 4: Japanese Unexamined Patent Application Publication No. 2003-123569
Patent Reference 5: Japanese Unexamined Patent Application Publication No. H04-286843
Patent Reference 6: Japanese Unexamined Patent Application Publication No. 2007-311117
Patent Reference 7: Japanese Unexamined Patent Application Publication No. 2002-150990
Patent Reference 8: WO99/05506

Non-Patent References

Non-patent Reference 1: H.-S. Kuo, I.-S. Hwang, T.-Y. Fu, J.-Y. Wu, C.-C. Chang, and T. T. Tsong, Nano Letters 4 (2004), p. 2379
Non-patent Reference 2: J. Morgan, J. Notte, R. Hill, and B. Ward, Microscopy Today, July 14, (2006), p. 24

SUMMARY OF THE INVENTION

Problems to be Solved by the Invention

A gas field ion source having a nano-pyramid structure at the tip of a conventional metal emitter has the following challenges. The characteristic of the ion source is use of an ion released from vicinity of one atom at the tip of the nano-pyramid. That is, the region from which the ion is released is narrow, and the ion light source has a small size of a nanometer or less. Consequently, by focusing the ion light source onto a sample at the same magnification or increasing the reduction ratio to about ½, the characteristic of the ion source can be maximally utilized. In a conventional gallium liquid metal ion source, the dimension of the ion light source is estimated as about 50 nm. Therefore, to realize a beam diameter of 5 nm on a sample, the reduction ratio has to be set to $\frac{1}{10}$ or less. In this case, vibration of the emitter tip of the ion source is reduced to $\frac{1}{10}$ or less on a sample. For example, even when the emitter tip vibrates by 10 nm, the vibration of a beam spot on a sample becomes 1 nm or less. Therefore, the influence of vibration of the emitter tip on the beam diameter of 5 nm is small. However, in the example, the reduction ratio is relatively large and is about 1 to ½.

Therefore, in the case where the reduction ratio is ½, the vibration of 10 nm at the emitter tip becomes vibration of 5 nm on a sample, the vibration of the sample for the beam diameter is large. That is, for example, to realize resolution of 0.2 nm, the vibration of the emitter tip has to be set to 0.1 nm or less at the maximum. The conventional ion source is not always sufficient from the viewpoint of prevention of vibration at the emitter tip.

The inventors of the present invention have paid attention to the face that a slight vibration at the emitter tip deteriorates the resolution of an observation image. From the viewpoint, there was an attempt to prevent vibration of the ion source by a supporting piece from the side wall of a vacuum vessel of an ion source. However, inflow of heat to the ion source via the supporting member is not considered. There is a problem such that the ion source brightness deteriorates due to rise in the temperature of the ion source. There is also a problem that the supporting member is deformed by cooling of the ion source. The inventors of the present invention found that by maintaining the low temperature of the ion light source and solving the problem of deformation in the supporting member by the cooling, the performance of the ion source can be maximally utilized.

As described above, the gas field ion source ionizes gas of helium or the like by a sharp emitter tip and extracts the resultant as an ion beam. When impurity is included in the gas molecules, there is a case such that the impurity is adhered to the vicinity of the emitter tip. When the helium which approaches the emitter tip is ionized, supply of the helium to the tip of the nano-pyramid decreases, and ion beam current decreases. That is, the existence of impurity gas makes the ion beam current unstable. The conventional ion source is not always sufficient from the viewpoint of reduction of impurity gas to the emitter tip. Particularly, consideration on gas generated when a beam limiting aperture or the like is irradiated with an ion beam is not sufficient.

The inventors of the present invention found a problem such that impurity gas or the like contained in gas generated when a limiting aperture or the like is irradiated with an ion beam, gas flowing from a sample chamber side to an ion source vacuum vessel, or an ion material gas supplied to an ion source is adhered to the end of the emitter tip and makes the ion beam current unstable.

An object of the present invention is to provide an ion beam device realizing high-resolution sample observation by reducing vibration of an emitter tip for a gas field ion source and to provide an ion beam device with a stable ion beam and realizing sample observation without brightness unevenness in an observation image.

Another object of the present invention is to provide a device of observing a section by an ion microscope and a section observing method by processing a sample with an ion beam to form a section and, in place of a device of observing a section by an electron microscope, forming a section by process with an ion beam and observing the section by an ion microscope.

Another object of the present invention is to provide a device capable of performing sample observation by an ion microscope, sample observation by an electron microscope, and an element analysis by a single device, an analyzing device for observing and analyzing a defect, a foreign matter, or the like, and an inspection device.

Means for Solving the Problems

According to the present invention, an ion beam device includes: a gas field ion source for generating an ion beam; an ion lens for focusing an ion beam extracted from the gas field ion source on a sample; a movable beam limiting aperture which limits an open angle of the ion beam to the ion lens; a sample stage on which the sample is mounted; and a vacuum vessel which houses the gas field ion source, the ion lens, the beam limiting aperture, the sample stage, and the like. The gas field ion source includes an emitter tip for generating an ion, an emitter base mount which supports the emitter tip, an ionization chamber having an extraction electrode provided so as to be opposed to the emitter tip and constructed so as to surround the emitter tip, and a gas supply pipe for supplying gas to vicinity of the emitter tip, and a mechanism which produces a noncontact magnetic interaction between the emitter base mount and the vacuum vessel is provided.

According to the invention, in the ion beam device, a part of the emitter base mount is made of a superconducting material.

According to the invention, in the ion beam device, when the beam limiting aperture is a hole opened in a plate, the irradiation direction of an ion beam and a normal to the plate have a tilt relation.

EFFECT OF THE INVENTION

The invention provides the ion beam device realizing high-resolution sample observation by reducing vibration of an emitter tip for a gas field ion source. An ion beam device realizing sample observation without brightness unevenness in an observation image using a stable ion beam is provided.

MODES FOR CARRYING OUT THE INVENTION

Figure 1:
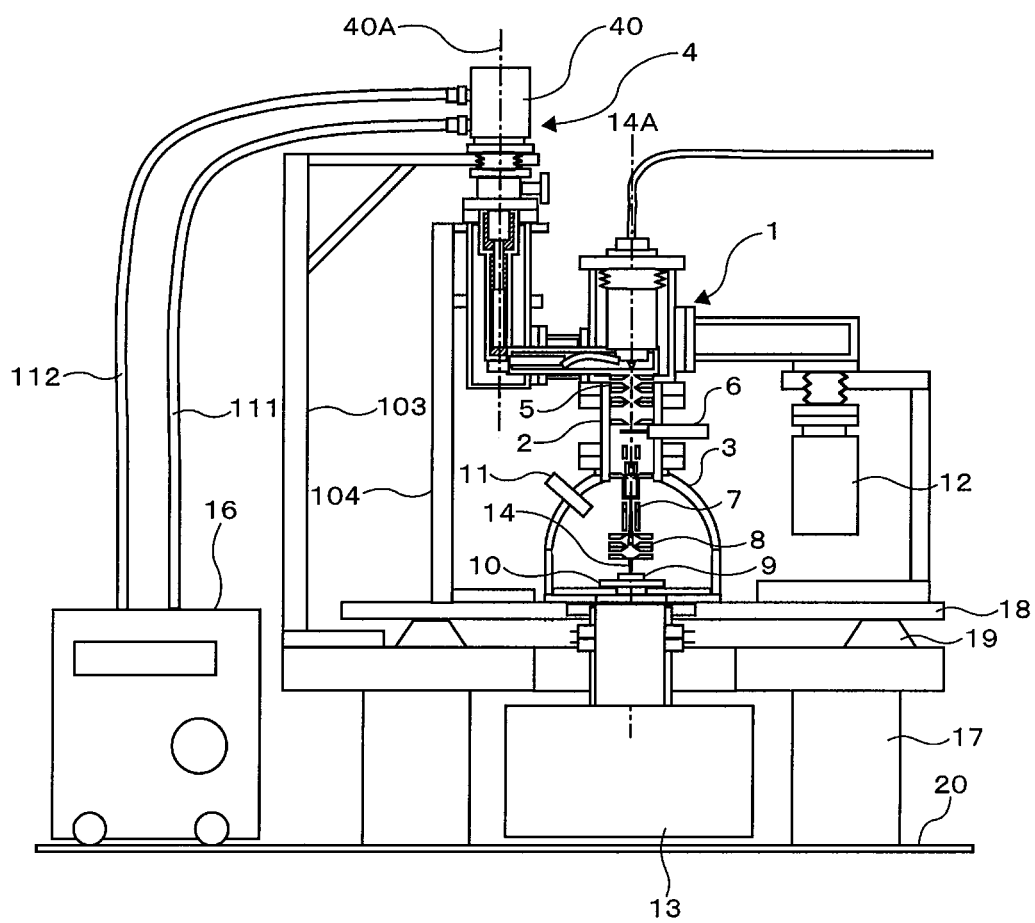
FIG. 1 is a schematic configuration diagram of a first example of an ion microscope according to the present invention.

Referring to FIG. 1, an example of an ion beam device according to the present invention will be described. In the following, a first example of a scanning ion microscope device as an ion beam device will be described. The scanning ion microscope of the example has a gas field ion source 1, an ion beam irradiation system column 2, a sample chamber 3, and a cooling mechanism 4. The ion beam irradiation system column 2 and the sample chamber 3 are held in vacuum. The ion beam irradiation system has an electrostatic-type condenser lens 5, a beam limiting aperture 6, a beam scanning electrode 7, and an electrostatic-type objective lens 8. In the sample chamber 3, a sample stage 10 on which a sample 9 is mounted, and a secondary particle detector 11 are provided. The sample 9 is irradiated with an ion beam 14 from the gas field ion source 1 via the ion beam irradiation system. A secondary particle beam from the sample 9 is detected by the secondary particle detector 11. Although not shown, an electron gun for neutralizing charge-up of the sample irradiated with the ion beam and a gas gun for supplying etching or deposition gas close to the sample are provided.

The cooling mechanism 4 has a refrigerator 40 for cooling the gas field ion source 1. In the ion microscope of the example, a center axial line 40A of the refrigerator 40 is disposed in parallel to an optical axis 14A of the ion beam irradiation system.

The ion microscope of the example further includes an ion source evacuation pump 12 for evacuating the gas field ion source 1 and a sample chamber evacuation pump 13 for evacuating the sample chamber 3.

On a device stand 17 disposed on a floor 20, a base plate 18 is disposed via a vibration preventing mechanism 19. The gas field ion source 1, the column 2, and the sample chamber 3 are supported by the base plate 18.

The device stand 17 is provided with a support pillar 103. The refrigerator 40 is supported by the support pillar 103. Vibration of the refrigerator 40 is transmitted to the device stand 17 via the support pillar 103. However, the vibration of the refrigerator 40 which is reduced by the vibration preventing mechanism 19 is transmitted to the base plate 18.

On the floor 20, a compressor unit (compressor) 16 using, for example, helium gas as operation gas is installed. A helium gas of high pressure is supplied to the refrigerator 4 of, for example, a Gifford-McMahon type (GM type) via a pipe 111. When the helium gas of high pressure periodically expands in the GM-type refrigerator, cold is generated. The low-pressure helium gas which is expanded and comes to have low pressure is collected by the compressor unit via a pipe 112.

The vibration of the compressor unit (compressor) 16 is transmitted to the device stand 17 via the floor 20. The vibration preventing mechanism 19 is disposed between the device stand 17 and the base plate 18, and there is a characteristic such that the high-frequency vibration of the floor is not easily transmitted to the gas field ion source 1, the ion beam irradiation system column 2, the vacuum sample chamber 3, and the like. Therefore, there is a characteristic such that the vibration of the compressor unit (compressor) 16 is not easily transmitted to the gas field ion source 1, the ion beam irradiation system column 2, and the sample chamber 3 via the floor 20. In the above description, the cause of the vibration of the floor 20 is the refrigerator 40 and the compressor 16. However, the cause of the vibration of the floor 20 is not limited to the above.

The vibration preventing mechanism 19 may be a vibration-proof rubber, a spring, a damper, or a combination of them. The base plate 18 is provided with a support pillar 104. The lower part of the cooling mechanism 4 is supported by the support pillar 104, which will be described later with reference to FIG. 3.

Although the vibration preventing mechanism 19 is provided on the device stand 17 in the example, the vibration preventing mechanism 19 may be provided for the leg of the device stand 17. The vibration preventing mechanism 19 may be provided both on the stand 17 and for the leg of the device stand 17.

Figure 2:
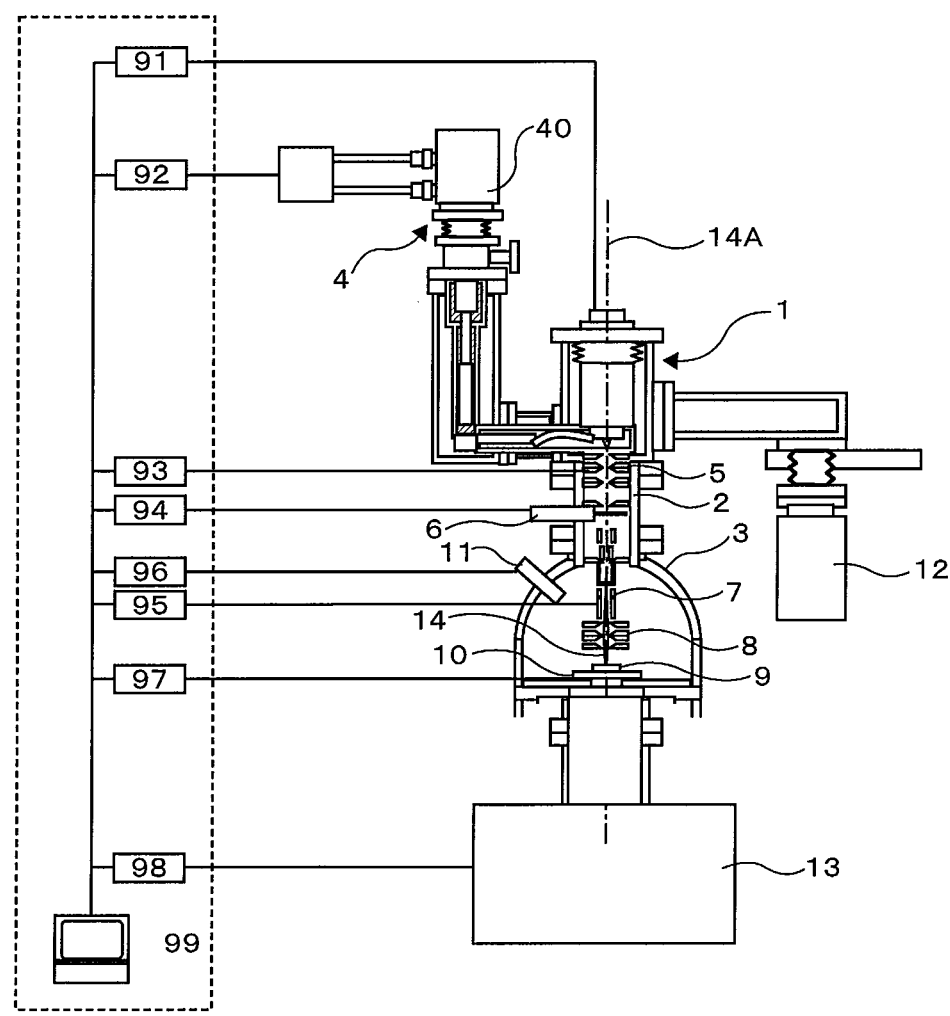
FIG. 2 is a schematic configuration diagram of a control system of the first example of the ion microscope according to the present invention.

FIG. 2 illustrates an example of a control system of the ion microscope according to the present invention shown in FIG. 1. The control system of the example has a gas field ion source controller 91 for controlling the gas field ion source 1, a refrigerator controller 92 for controlling the refrigerator 40, a lens controller 93 for controlling the condenser lens 5, a beam limiting aperture controller 94 for controlling the beam limiting aperture 6, an ion beam scanning controller 95 for controlling the beam scanning electrode 7, a secondary particle detector controller 96 for controlling the secondary particle detector 11, a sample stage controller 97 for controlling the sample stage 10, an evacuation pump controller 98 for controlling the sample chamber evacuation pump 13, and a computer processor 99 for performing various arithmetic operations. The computer processor 99 has an image display unit. The image display unit displays an image generated from a detection signal of the secondary particle detector 11 and information which is input by input means.

The sample stage 10 has a mechanism of linearly moving the sample 9 in two orthogonal directions in the sample mount plane, a mechanism of linearly moving the sample 9 in a direction perpendicular to the sample mount plane, and a mechanism of turning the sample 9 in the sample mount plane. The sample stage 10 further has a tilting function capable of varying the irradiation angle to the sample 9 of the ion beam 14 by turning the sample 9 about the tilt axis. The controls are executed by the sample stage controller 97 in accordance with an instruction from the computer processor 99.

The operation of the ion beam irradiation system of the ion microscope of the example will be described. The operation of the ion beam irradiation system is controlled by an instruction from the computer processor 99. The ion beam 14 generated by the gas field ion source 1 is condensed by the condenser lens 5, its beam diameter is limited by the beam limiting aperture 6, and the resultant beam is condensed by the objective lens 8. The condensed beam is emitted to scan the surface of the sample 9 on the sample stage 10.

Secondary particles released from the sample are detected by the secondary particle detector 11. A signal from the secondary particle detector 11 is subjected to brightness modulation, and the resultant signal is sent to the computer processor 99. The computer processor 99 generates a scan ion microscope image and displays it on the image display unit. In such a manner, high-resolution observation on the sample surface can be realized.

Figure 3:
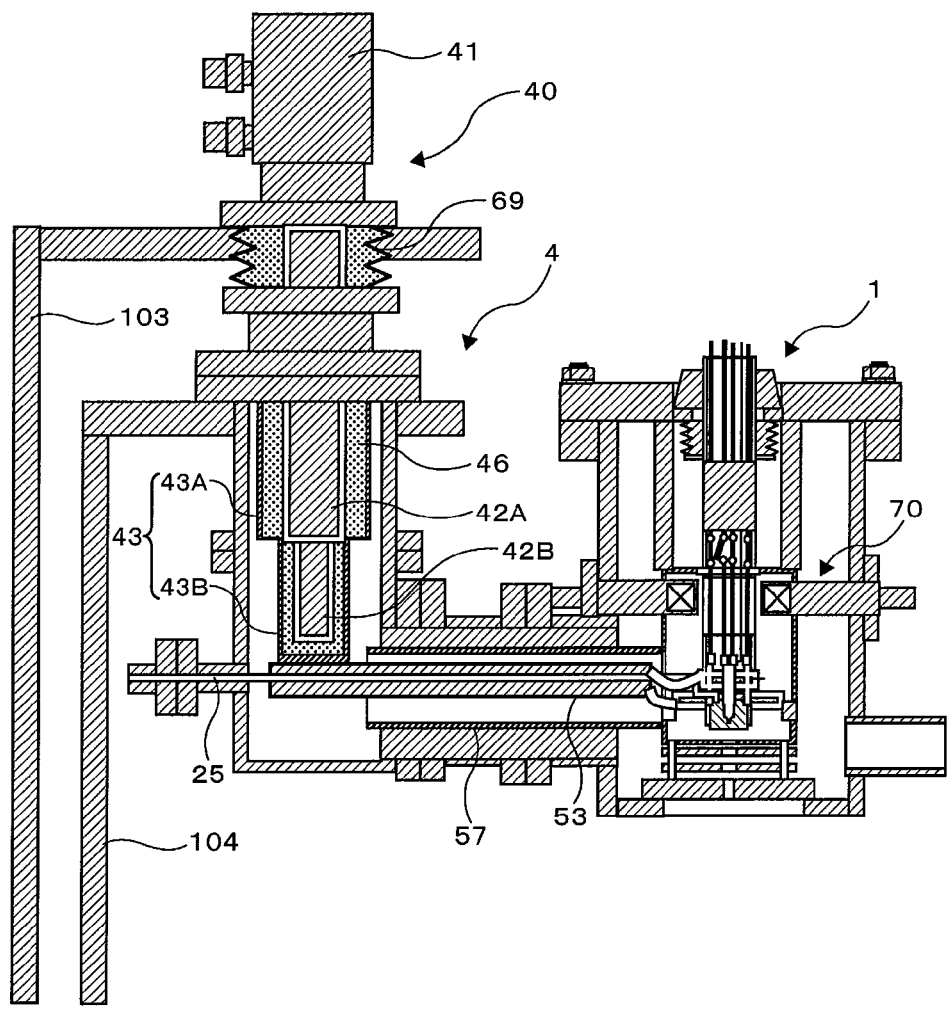
FIG. 3 is a schematic structure diagram of a cooling mechanism of a gas field ion source in the first example of the ion microscope according to the invention.

FIG. 3 shows an example of the configuration of the gas field ion source 1 and its cooling mechanism 4 in the ion microscope according to the invention illustrated in FIG. 1. The gas field ion source 1 and a vibration preventing mechanism 70 of an emitter tip will be described in detail with reference to FIG. 4. The cooling mechanism 4 will be described here. In the example, as the cooling mechanism 4 of the gas field ion source 1, a cooling mechanism obtained by combining the GM-type refrigerator 40 and a helium gas pot 43 is used. The center axial line of the GM-type refrigerator is disposed in parallel to the optical axis of the ion beam irradiation system passing an emitter tip 21 of the ion microscope. With the configuration, both improvement in convergence of the ion beam and improvement in the refrigerating function can be satisfied.

The GM-type refrigerator 40 has a body 41, a first cooling stage 42A, and a second cooling stage 42B. The body 41 is supported by the support pillar 103. The first and second cooling stages 42A and 42B are hanged from the body 41.

The outside diameter of the first cooling stage 42A is larger than that of the second cooling stage 42B. The refrigeration capacity of the first cooling stage 42A is about 5 W, and that of the second cooling stage 42B is about 0.2 W. The first cooling stage 42A is cooled to about 50K. The second cooling stage 42B can be cooled to 4K.

The upper end part of the first cooling stage 42A is surrounded by a bellows 69. The lower end part of the first cooling stage 42A and the second cooling stage 42B are covered with the gas-sealing pot 43. The pot 43 has a part 43A having a large diameter and configured to surround the first cooling stage 42A and a part 43B having a small diameter and configured to surround the second cooling stage 42B. The pot 43 is supported by the support pillar 104. The support pillar 104 is supported by the base plate 18 as shown in FIG. 1.

Each of the bellows 69 and the pot 43 has a sealed structure filled with helium gas 46 as a heat conduction medium. The two cooling stages 42A and 42B are surrounded by the helium gas 46 but are in non-contact with the pot 43. In place of the helium gas, neon gas or hydrogen may be used.

In the GM-type refrigerator 40, the first cooling stage 42A is cooled to about 50K. Consequently, the helium gas 46 in the periphery of the first cooling stage 42A is cooled to about 70K. The second cooling stage 42B is cooled to 4K. The helium gas 46 in the periphery of the second cooling stage 42B is cooled to about 6K. In such a manner, the lower end of the pot 43 is cooled to about 6K.

The vibration of the body 41 of the GM-type refrigerator 40 is transmitted to the support pillar 103 and the two cooling stages 42A and 42B. The vibration transmitted to the cooling stages 42A and 42B is attenuated in the helium gas 46. Even when the cooling stages 42A and 42B in the GM-type refrigerator vibrate, due to the existence of the helium gas in the middle, heat is conducted but mechanical vibration attenuates. Consequently, the vibration does not easily propagate to the sealed pot 43 which is cooled in the first and second stages 41 and 42. Particularly, vibration of high frequency is not easily transmitted. There is, consequently, an effect such that the mechanical vibration of the pot 43 is reduced much more than that of the cooling stages 42A and 42B of the GM-type refrigerator.

As described with reference to FIG. 1, the vibration of the compressor 16 is transmitted to the device stand 17 via the floor 20 and is prevented from being transmitted to the base plate 18 by the vibration preventing mechanism 19. Therefore, the vibration of the compressor 16 is not transmitted to the support pillar 104 and the pot 43.

The lower end of the pot 43 is connected to a cooling conduction rod 53 made of copper and having high thermal conductivity. A gas supply pipe 25 is provided in the cooling conduction rod 53. The cooling conduction rod 53 is covered with a cooling conduction pipe 57 made of copper.

In the example, a not-shown shield for reducing thermal radiation is connected to the part 43A having a large diameter of the pot 43, and the radiation shield is connected to the cooling conduction pipe 57 made of copper. Therefore, the cooling conduction rod 53 and the cooling conduction pipe 57 are always held at the same temperature as that of the pot 43.

Although the GM-type refrigerator 40 is used in the example, in place of it, a pulse tube refrigerator or Stirling refrigerator may be used. Although the refrigerator has two cooling stages in the example, the refrigerator may have a single cooling stage. The number of cooling stages is not limited.

Figure 4:
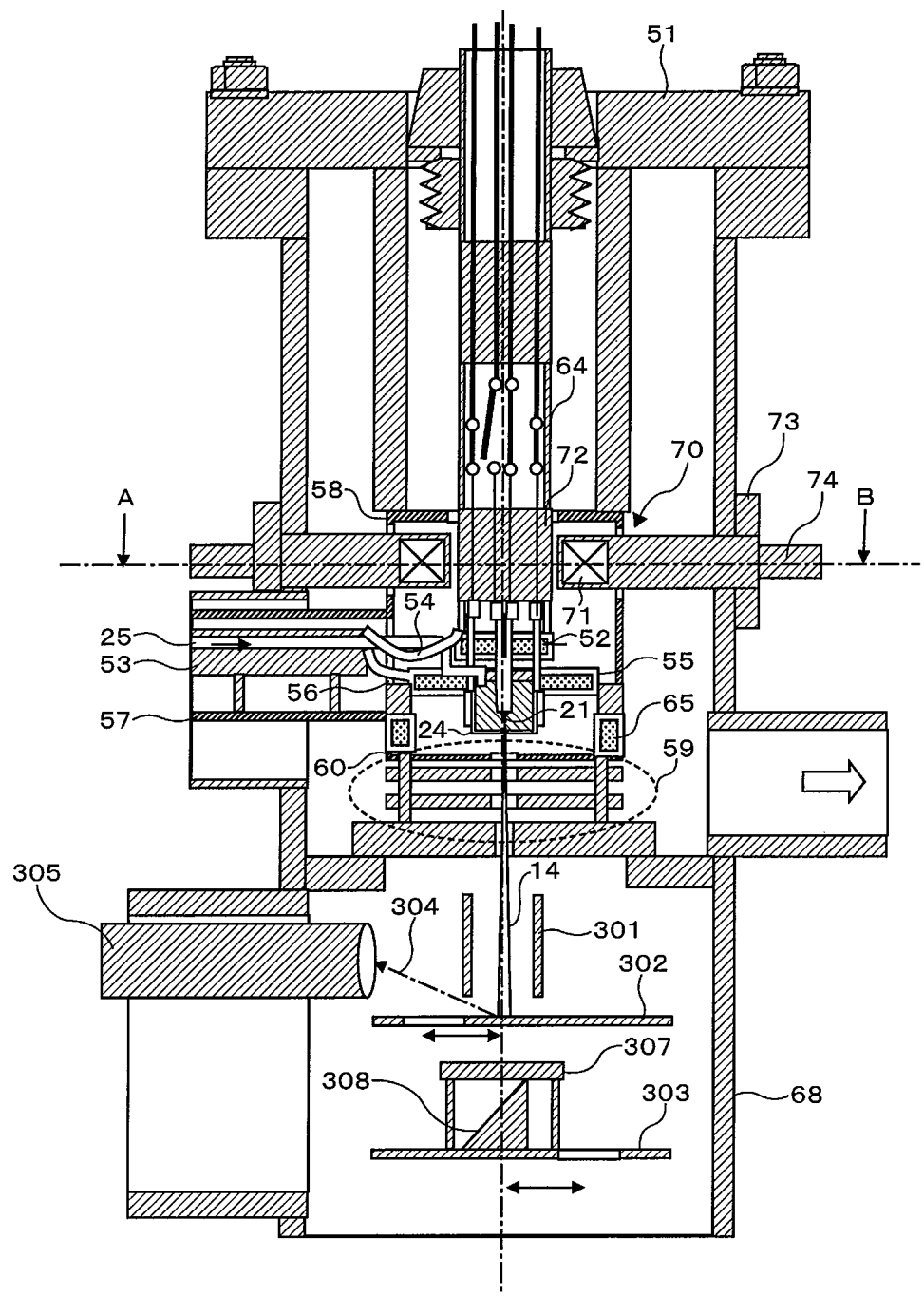
FIG. 4 is a schematic structure diagram of the gas field ion source in the first example of the ion microscope according to the invention.
Figure 5:
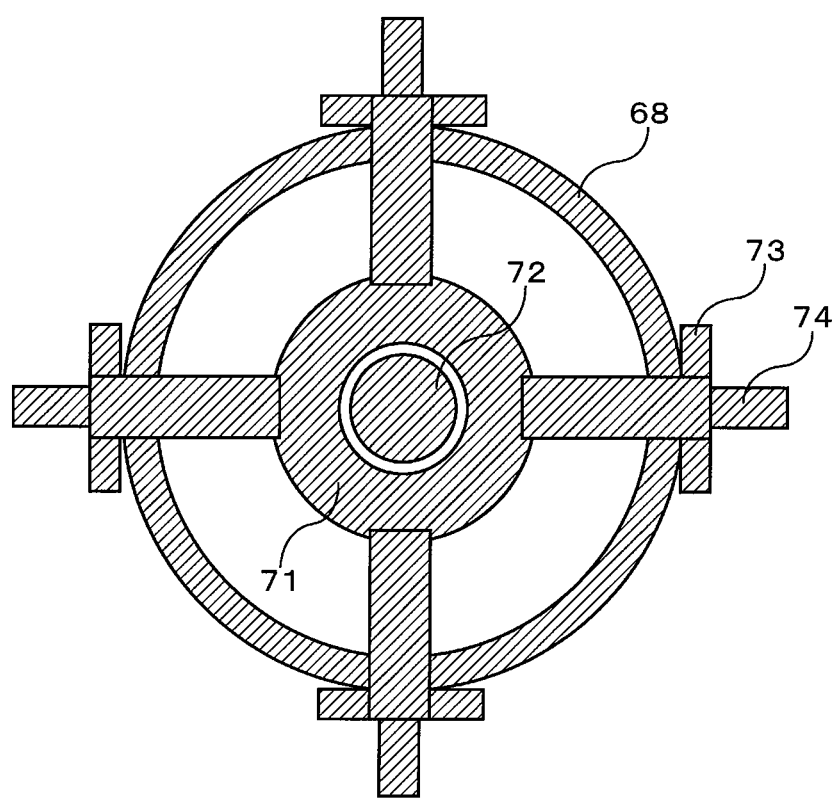
FIG. 5 is a cross section of a vibration preventing mechanism of the gas field ion source in the first example of the ion microscope according to the invention.
Figure 6:
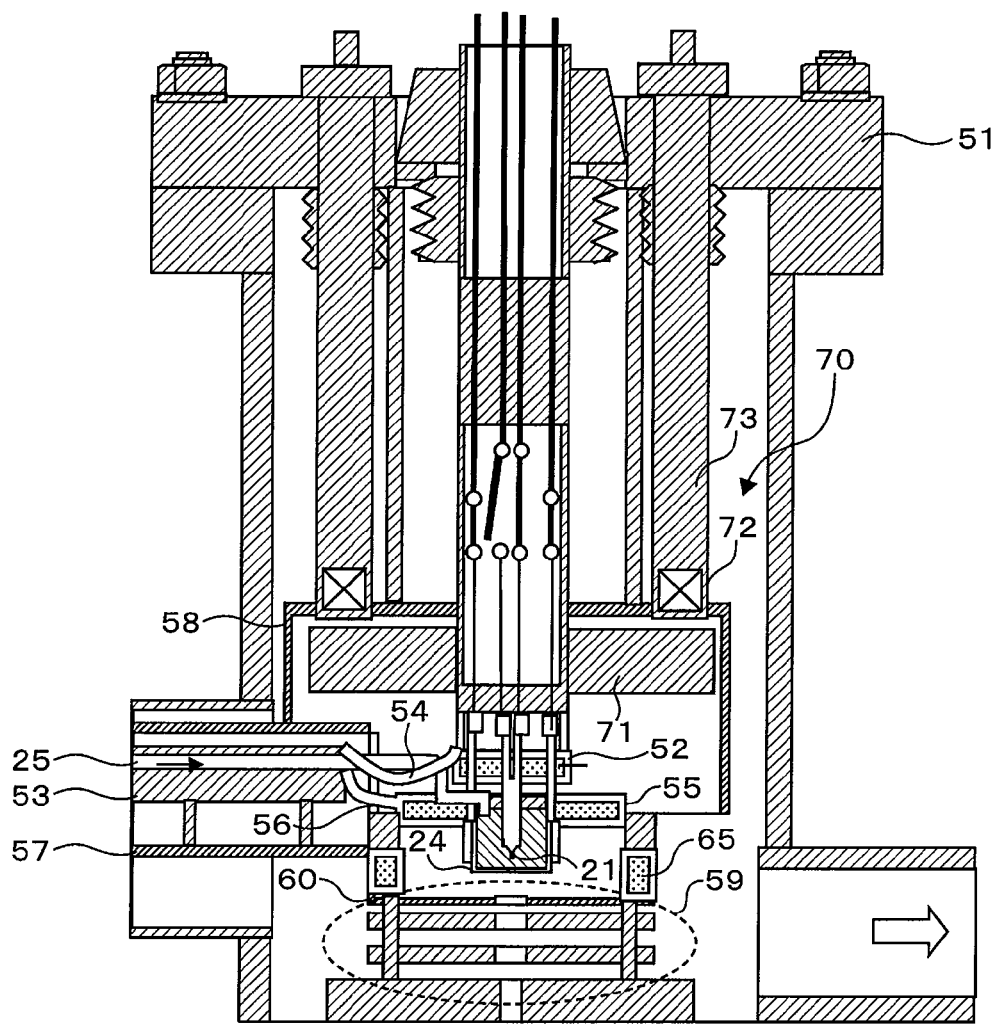
FIG. 6 is a schematic structure diagram of the vibration preventing mechanism of the gas field ion source in the first example of the ion microscope according to the invention.

Referring to FIG. 4, an example of the configuration of the gas field ion source, the emitter tip vibration preventing mechanism 70, and the periphery of the ion microscope according to the invention will be described in detail. FIG. 5 is a cross section taken line A-B of FIG. 4. The gas field ion source of the example has the emitter tip 21, an emitter base mount 64, an extraction electrode 24, and an electrostatic lens 59. The extraction electrode 24 has a hole through which an ion beam passes. In the example, the electrostatic lens 59 has three electrodes each having a center hole. The emitter tip 21 is disposed so as to be opposed to the extraction electrode 24.

Below the electrostatic lens 59, a scanning deflection electrode 301, an aperture grill 302, a shutter 303, and a secondary particle detector 305 are provided. An ion beam passes along a center line 306 of the ion irradiation system.

The emitter tip 21 is hanged from an upper flange 51, and the support part of the emitter tip 21 has a movable structure. On the other hand, the extraction electrode 24 is fixedly attached to a vacuum vessel 68. The vacuum vessel 68 is an upper structure of the column shown in FIG. 1.

The emitter tip 21 is supported by a sapphire base 52. The sapphire base 52 is connected to the cooling conduction rod 53 via a copper stranded wire 54. The extraction electrode 24 is supported by a sapphire base 55. The sapphire base 55 is connected to the cooling conduction rod 53 via a copper stranded wire 56. Therefore, a heat transfer path is constructed by the emitter tip 21, the sapphire base 52, the copper stranded wire 54, the cooling conduction rod 53, and the pot 43. Similarly, a heat transfer path is constructed by the extraction electrode 24, the sapphire base 55, the copper stranded wire 56, the cooling conduction rod 53, and the pot 43.

The cooling mechanism has cold generating means which generates cold by making first high-pressure gas generated by the compressor unit expand, and a cooling mechanism for cooling the emitter tip 21 as a member to be cooled by a second gas as helium gas in the pot 43 which is cooled by the cold of the cold generating means.

A radiation shield 58 is provided so as to surround the emitter tip 21 and the extraction electrode 24. The radiation shield 58 reduces thermal inflow by thermal radiation to the extraction electrode 24 and the ionization chamber. The radiation shield 58 is connected to the cooling conduction pipe 57. An electrode 60 closest to the extraction electrode 24 among three electrodes of the electrostatic lens 59 is connected to the radiation shield 58. A heat transfer path is constructed by the electrode 60, the radiation shield 58, the cooling conduction pipe 57, the radiation shield, and the pot 43.

In the example, the sapphire bases 52 and 55 and the cooling conduction rod 53 are connected via deformable copper stranded wires 54 and 56. The copper stranded wire 54 has the function of holding the heat transfer path made by the emitter tip 21, the sapphire base 52, and the cooling conduction rod 53 even if the position of the emitter tip 21 displaces. Further, the copper stranded wire 54 having high flexibility prevents the high-frequency vibration from being transmitted to the sapphire base 52 and the emitter tip 21 via the cooling conduction rod 53. The copper stranded wire 56 prevents the high-frequency vibration from being transmitted to the sapphire base 55 and the extraction electrode 24 via the cooling conduction rod 53. The copper stranded wire 54 as a heat transfer member is not limited to copper but a flexible member which has high thermal conductivity and does not easily transmit vibration, such as a silver stranded wire may also be employed.

The device is, as already described, configuration so that vibration from the floor and the vibration of the refrigerator are attenuated and transmitted to the emitter tip. However, to maximally use the characteristics of the ion source, the following vibration preventing mechanism is also provided. Specifically, a diamagnetic block 71 is inserted in a part of the emitter base mount 64 connected to the sapphire base 52, and a ring-shaped electromagnet 72 is disposed around the diamagnetic block 71. Preferably, the diamagnetic block 71 is made of a substance which exhibits diamagnetism at extremely low temperature, for example, $Er_3Ni$. The ring-shaped electromagnet is fixed to the vacuum vessel 68 by a supporting member 73. When the electromagnet 72 is allowed to operate, repulsion force works as a magnetic interaction work between the electromagnet 72 and the diamagnetic block 71, and a force of fixing the diamagnetic block 71 to the electromagnet works. The position of the ring-shaped electromagnet 72 can be adjusted by operating a knob 74 from the outside of the vacuum vessel, and the emitter tip position can be adjusted. The diamagnetic block 71 and the ring-shaped electromagnet 72 are not in contact with each other, and heat is not transmitted to the emitter tip by conduction. Consequently, the emitter tip 21 is held at extremely low temperature, and there is an effect such that ion current from the emitter tip can be increased.

In place of the electromagnet of the embodiment, a permanent magnet may be disposed around the diamagnetic block.

When the electromagnet of the example is constructed by a superconducting coil, the emitter tip is firmly fixed by a stronger magnetic field. In this case, the superconducting block is connected to the radiation shield 58 which is cooled, and the superconducting block is cooled to a superconducting state. Further, for the supporting member 73, a material having low thermal conductivity, for example, fiber-glass reinforced plastic, a PEEK material, or the like is used. By using such a material, transmission of heat to the superconductor material is reduced, and a superconducting state is maintained.

In the above example, the force of fixing the emitter tip works in a direction perpendicular to the ion beam extraction direction. In this case, an ion beam device particularly with improved resolution of an ion image is realized. Alternately, the diamagnetic block 71 and the electromagnet 72 may be disposed as shown in FIG. 5 so that the force of fixing the emitter tip 21 works in the direction parallel to the ion beam extraction direction. In this case, the distance between the emitter tip and the extraction electrode is maintained constant, and an effect such that the stable ion beam current is obtained is produced. By combining both of the cases, firmer fixation of the emitter tip is realized, and the effects of both of the cases can be realized.

In the embodiment, extremely low temperature of the emitter tip is realized, the gas field ion source capable of obtaining an ion beam of larger current is provided and, moreover, an effect such that the ion microscope realizing high-resolution observation is provided is obtained.

Although the extraction electrode is fixed to the vacuum vessel in the gas field ion source of the example, the emitter tip is movable with respect to the extraction electrode. Consequently, the position adjustment of the emitter tip with respect to the hole of the extraction electrode and the axis adjustment of the emitter tip with respect to the optical system can be performed so that a fine ion beam can be formed.

The emitter base mount in the specification denotes a member or a part of the member for supporting the emitter tip from the vacuum vessel. The term "non-contact" in the case of fixing the emitter base mount in a non-contact manner means that a member which is in contact is not always necessary to generate the fixing force. Even when there is a member which is in contact for the purpose of, for example, voltage supply or connection of a wire, not the purpose of the fixing force, the state is defined as "non-contact".

The axis adjustment of the emitter tip will be described. By moving the shutter 302, a hole provided in the shutter 302 is deviated from the center axial line 306 of the ion beam irradiation system. The ion beam 14 generated by the emitter tip 21 passes through the electrostatic lens 59, the scanning deflection electrode 301 and, further, a hole in the aperture grill 302, and collides with the shutter 302. From the shutter 302, secondary particles 304 such as secondary electrons are generated. The secondary particles 304 are detected by the secondary particle detector 304, and a secondary particle image can be obtained. By providing small projections in the upper part of the shutter 302, an ion radiation pattern of the emitter tip can be observed in the secondary particle image. An ion radiation pattern can also be observed by forming fine holes, mechanically scanning the aperture grill 302 in two directions perpendicular to the ion beam, and detecting secondary particles generated when another shutter plate is irradiated with the ion beam passed through the aperture grill 302.

While observing the ion radiation pattern in such a manner, the position and angle of the emitter tip are adjusted. After the axis adjustment of the emitter tip, the shutter 302 is moved. With the movement, the ion beam passes through the hole in the shutter 302. In addition, a variable radiation pattern observation mechanism 303 can be used. Specifically, the movable radiation pattern observation mechanism 303 is moved to deviate the hole formed in the movable radiation pattern observation mechanism 303 from the center axis line 306 of the ion beam radiation system. In the movable radiation pattern observation mechanism 303, an ion image detector 307 made by a microchannel plate and a fluorescent plate is disposed. An image of the fluorescent plate can be observed by a mirror disposed below the ion image detector 307. That is, the ion beam radiation direction and the radiation pattern can be observed. After completion of the observation, the hole provided in the movable radiation pattern observation mechanism 303 is returned to the center axis line 306 of the ion beam radiation system to make the ion beam pass.

Figure 7:
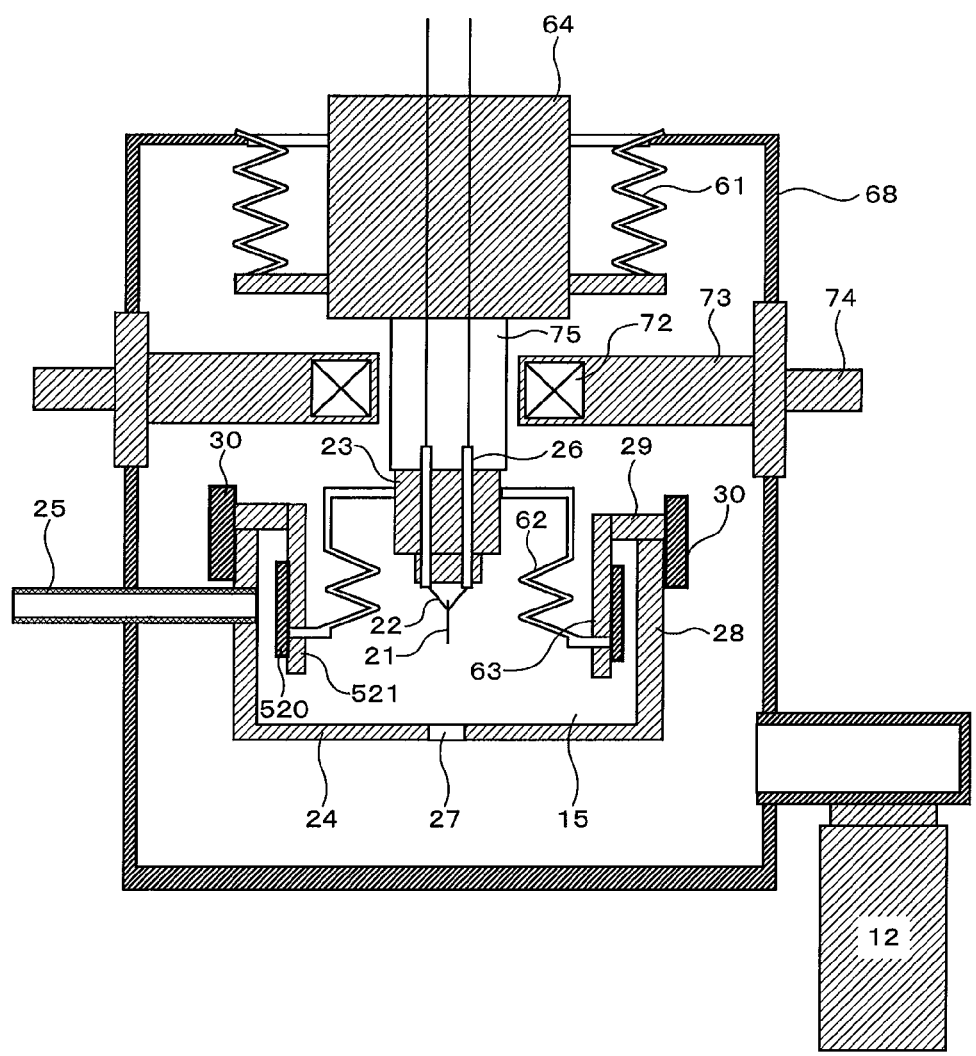
FIG. 7 is a schematic structure diagram of an ionization chamber in the gas field ion source in the first example of the ion microscope according to the invention.

With reference to FIG. 7, the configuration of the gas field ion source of the ion microscope according to the present invention will be described more specifically. Another example of the above-described method of fixing the emitter tip 21 in a non-contact manner will be described. The gas field ion source of the example has the emitter tip 21, a pair of filaments 22, a filament mount 23, a supporting rod 26, and the emitter base mount 64. The emitter tip 21 is fixed to the filaments 22. The filaments 22 are fixed to the supporting rod 26. The supporting rod 26 is supported by the filament mount 23. The filament mount 23 is fixed to the emitter base mount 64. The emitter base mount 64 is attached to the upper flange 51 as shown in FIG. 4. The emitter base mount 64 and the radiation shield 58 or the vacuum vessel 68 are connected by a bellows 61.

As already described, the device is configuration so that vibration from the floor and the vibration of the refrigerator are not transmitted to the emitter tip. However, to maximally use the characteristics of the ion source, the following vibration preventing mechanism is also provided. Specifically, a superconductor block 75 is inserted in a part of the emitter base mount 64 connected to the sapphire base 52, and the ring-shaped electromagnet 72 is disposed around the semiconductor block 75. The ring-shaped electromagnet is fixed to the vacuum vessel 68 by the supporting member 73. The position of the ring-shaped electromagnet 72 can be adjusted by operating the knob 74 from the outside of the vacuum vessel.

The gas field ion source of the example further includes the extraction electrode 24, a cylindrical-shape resistive heater 30, a cylindrical side wall 28, and a top plate 29. The extraction electrode 24 has a hole 27 which is disposed so as to be opposed to the emitter tip 21 and through which the ion beam 14 passes. An insulating material 63 is connected to the top plate 29. A bellow 62 is attached between the insulating material 63 and the filament mount 23.

The side wall 28 and the top plate 29 surround the emitter tip 21. The space surrounded by the extraction electrode 24, the side wall 28, the bellows 62, the insulating material 63, and the filaments 23 is called an ionization chamber 15.

To the ionization chamber 15, the gas supply pipe 25 is connected. By the gas supply pipe 25, an ion material gas (ionizable gas) is supplied to the emitter tip 21. The ion material gas (ionizable gas) is helium or hydrogen.

The ionization chamber 15 is closed except for the hole 27 in the extraction electrode 24 and the gas supply pipe 25. The gas supplied into the ionization chamber via the gas supply pipe 25 is not leaked from the area other then the hole 27 in the extraction electrode 24 and the gas supply pipe 25. By sufficiently reducing the diameter of the hole 27 in the extraction electrode 24, high airtightness and high sealing performance can be held in the ionization chamber. The diameter of the hole 27 in the extraction electrode 24 is, for example, 0.2 mm or less. Consequently, when the ionizable gas is supplied from the gas supply pipe 25 to the ionization chamber 15, the gas pressure in the ionization chamber 15 becomes higher than that in the vacuum vessel by at least one digit. The ratio that the ion beam collides with the gas in vacuum and is neutralized is therefore reduced, and the ion beam of large current can be generated. Even when a hole of conductance smaller than that of the hole in the extraction electrode is formed in the ionization chamber, the effects of the present invention are not lost.

The resistive heater 30 is used to perform degasifying process on the extraction electrode 24, the side wall 28, and the like. By heating the extraction electrode 24, the side wall 28, and the like, the degasifying is accelerated. The resistive heater 30 is disposed on the outside of the ionization chamber 15. Therefore, even if the resistive heater itself performs the degasifying operation, it is performed on the outside of the ionization chamber, so that the inside of the ionization chamber can be made under high vacuum.

Although the resistive heater is used for the degasifying process in the example, in place of the resistive heater, a lamp for heating may be used. Since a lamp for heating can heat the extraction electrode 24 in a non-contact manner, the peripheral structure of the extraction electrode can be simplified. Further, since it is unnecessary to apply high voltage in the lamp for heating, the structure of the power source of the lamp for heating is simple. Further, in place of using the resistive heater, an inactive gas of high temperature may be supplied via the gas supply pipe 25 to heat the extraction electrode, the side wall, and the like, and perform the degasifying process. In this case, a gas heating mechanism can be set to ground potential. Further, the peripheral structure of the extraction electrode becomes simple, and a wire and a power source are unnecessary.

By the resistive heater attached to the sample chamber 3 and the pump 13 for evacuating the sample chamber, the sample chamber 3 and the pump 13 for evacuating the sample chamber may be heated to about 200° C., and the degree of vacuum in the sample chamber 3 may be set to $10^{-7}$ Pa at the maximum. By the operation, when a sample is irradiated with an ion beam, the surface of the sample is avoided from being contaminated, and the surface of the sample can be observed excellently. In the conventional technique, when the surface of a sample is irradiated with a beam of helium ion or hydrogen ion, since growth of deposition by contamination is fast, there is the case that observation of the sample surface becomes difficult. Consequently, the sample chamber 3 and the pump 13 for evacuating the sample chamber are subjected to heating process in the vacuum state, and the hydrocarbon-based residual gas in the vacuum of the sample chamber 3 is reduced to a very small amount. As a result, the most surface of the sample can be observed with high resolution.

Next, the operation of the gas field ion source of the example will be described. The vacuum vessel is evacuated by the ion source evacuation pump 12. By the resistive heater 30, process of degasifying the extraction electrode 24, the side wall 28, and the top plate 29 is performed. Specifically, by heating the extraction electrode 24, the side wall 28, and the top plate 29, degasifying is performed. Simultaneously, another resistive heater may be disposed on the outside of the vacuum vessel to heat the vacuum vessel. With the configuration, the degree of vacuum in the vacuum vessel improves, and the temperature of the residual gas decreases. By the operation, time stability of ion emission current can be improved.

After completion of the degasifying process, heating by the resistive heater 30 is stopped. After lapse of sufficient time, the refrigerator is operated. By the operation, the emitter tip 21, the extraction electrode 24, the radiation shield 58, and the like are cooled. Next, ionization gas is introduced by the gas supply pipe 25 into the ionization chamber 15. The ionization gas is helium or hydrogen. Description will be given on assumption that the ionization gas is helium. As described above, the degree of vacuum in the ionization chamber is high. Therefore, the ratio that the ion beam generated by the emitter tip 21 collides with the residual gas in the ionization chamber and is neutralized decreases. Consequently, a high-current ion beam can be generated. The number of helium gas molecules of high temperature which collide with the extraction electrode decreases. It can decrease the cooling temperature of the emitter tip and the extraction electrode. Therefore, the high-current ion beam can be emitted to a sample.

Next, voltage is applied across the emitter tip 21 and the extraction electrode 24. An intense electric field is generated at the end of the emitter tip. Most of helium supplied from the gas supply pipe 25 is pulled to the emitter tip face by the intense electric field. The helium reaches near the end of the emitter tip where the electric field is tensest. The helium ionizes and a helium ion beam is generated. The helium ion beam is led to the ion beam radiation system via the hole 27 in the extraction electrode 24.

The emitter tip fixing method, that is, a vibration preventing mechanism using a superconductor block in a part of the emitter tip mount connected to the sapphire base 52 will be described later.

Next, the structure of the emitter tip 21 and the method of producing the same will be described. First, a tungsten wire having a diameter of about 100 to 400 μm and whose axial direction <111> is prepared, and its tip is sharpened. As a result, the emitter tip whose end has a radius of curvature of about 10 nm is obtained. At the end of the emitter tip, platinum is vacuum-deposited in another vacuum vessel. Next, the platinum atom is moved to the end of the emitter tip in high-temperature heating. As a result, a pyramid-shaped structure in nanometer order by the platinum atom is formed. The structure will be called a nano-pyramid. The nano-pyramid typically has one atom at its end, a layer of three or six atoms below the one atom, and a layer of ten or more atoms below the layer.

Although the thin wire of tungsten is used in the example, a thin wire of molybdenum can also be used. Although coating of platinum is used in the example, coating of iridium, rhenium, osmium, palladium, rhodium, or the like can also be used.

In the case of using helium as the ionization gas, it is important that the evaporation intensity of a metal is higher than the electric field intensity at which helium ionizes. Therefore, the coating of platinum, rhenium, osmium, or iridium is preferable. In the case of using hydrogen as the ionization gas, coating of platinum, rhenium, osmium, palladium, rhodium, or iridium is preferable. Although the coating of any of the metals can be formed by vacuum deposition, it can also be formed by plating in a solution.

As another method of forming the nano-pyramid at the end of the emitter tip, field evaporation in vacuum, ion beam radiation, or the like may also be employed. By any of such methods, the tungsten atom or molybdenum atom pyramid can be formed at the end of the tungsten wire or molybdenum wire. For example, in the case of using a tungsten wire of <111>, the end is constructed by three tungsten atoms.

As described above, the characteristic of the emitter tip 21 of the gas field ion source according to the present invention is the nano-pyramid. By adjusting the electric field intensity formed at the end of the emitter tip 21, a helium ion can be generated near the one atom at the end of the emitter tip. Therefore, a region from which an ion is emitted, that is, an ion light source is an extremely narrow region which is a nanometer or less. By generating an ion from the very limited region as described above, the beam diameter of 1 nm or less can be realized. Consequently, the unit area of the ion source and the current value per unit solid angle becomes large. This is an important characteristic to obtain a high-current ion beam having a very small diameter on a sample.

Particularly, in the case of depositing platinum on tungsten, the nano-pyramid structure in which one atom exists at the end is stably formed. In this case, the generation place of the helium ion is concentrated near the one atom at the end. In the case of three atoms at the end of tungsten <111>, the generation place of the helium ion is dispersed to places near the three atoms. Therefore, the current emitted from the unit area/unit solid angle in the ion source having the nano-pyramid structure of platinum in which the helium gas is concentratedly supplied to the one atom is larger. That is, the emitter tip in which platinum is deposited on tungsten produces effects such that the beam diameter on the sample of the ion microscope is reduced, and current is increased. Even if rhenium, osmium, iridium, palladium, rhodium, or the like is used, in the case where a nano-pyramid having one atom at its end is formed, current emitted from the unit area/unit solid angle can also be increased. It is therefore preferable to reduce the diameter of a beam on a sample of the ion microscope or increase current.

Figure 8:
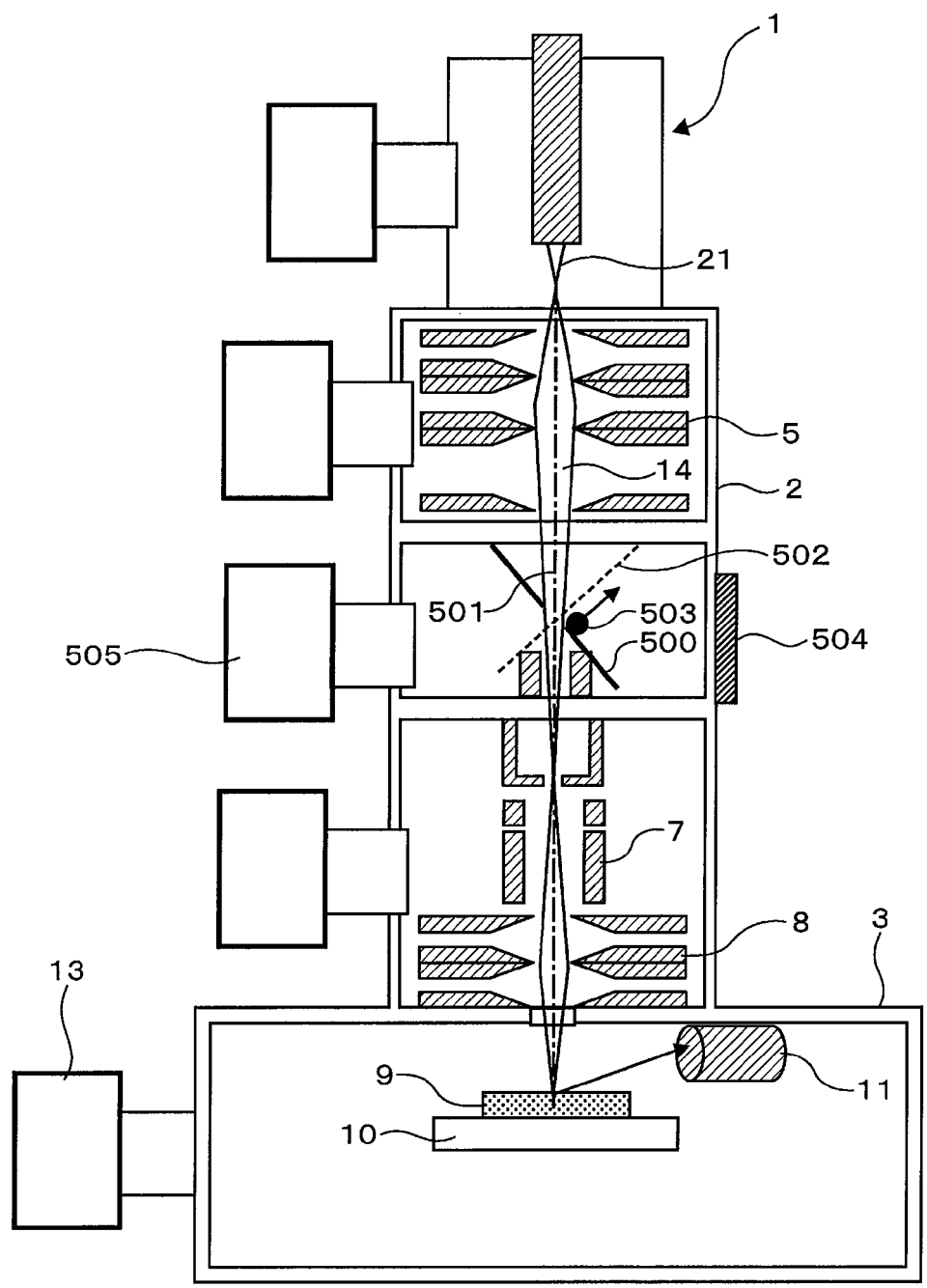
FIG. 8 is a schematic configuration diagram showing a beam limiting aperture tilt in the first example of the ion microscope according to the invention.

FIG. 8 shows an ion beam device related to reduction of adhesion of desorption gas from a beam limiting aperture to the emitter tip. As already described, the ion beam 14 generated by the gas field ion source 1 is condensed by the condenser lens 5, the beam diameter is regulated by the beam limiting aperture 6, and the resultant beam is focused by the objective lens 8. The focused beam is emitted to scan the sample 9 on the sample stage 10. For the conventional ion microscope, a sufficient measure is not employed from the viewpoints of adhesion of gas generated when an ion beam is emitted to a beam limiting aperture or the like to the emitter tip, and deterioration in stability of ion beam current. That is, the inventors of the present invention have found a problem such that desorption molecules generated when the beam limiting aperture or the like is irradiated with an ion beam are adhered to the end of the emitter tip and it makes the ion beam current unstable. Specifically, when helium which becomes close to the molecules adhered to the end of the emitter tip is ionized, supply of helium to the tip of the nano-pyramid is reduced, and the ion beam current decreases. That is, the existence of impurity gas makes the ion beam current unstable.

When the beam limiting aperture is a hole formed in a plate 500, in the present invention, a radiation direction 501 of an ion beam and a normal 502 to the plate have a tilt relation as shown in FIG. 8. With the configuration, most of desorption molecules 503 generated when the beam limiting aperture 500 is irradiated with the ion beam 14 do not fly toward the emitter tip 21, and molecules adhered to the emitter tip 21 dramatically decrease. Therefore, the ion beam device with a stable ion beam current which enables sample observation having no brightness unevenness in an observation image is provided. In particular, it has been found that when the angle between the radiation direction of the ion beam and the normal of the plate is set to 45 degrees or larger, impurity gas molecules are hardly adhered to the emitter tip, and the ion beam current is stabilized.

The inventors of the present invention have also found that it is particularly effective when the degree of vacuum in the vacuum vessel containing the beam limiting aperture is set to $10^{-7}$ Pa or less from the viewpoint that the impurity gas adhered to the beam limiting aperture desorbs. The vacuum vessel containing the beam limiting aperture has a baking heater 504 which can be heated to about 200° C. By baking the vacuum vessel while performing evacuation, the degree of vacuum can be set to $10^{-7}$ Pa or less. It is more effective that the plate 500 of the beam limiting aperture is cleaned with plasma to a state where adhered molecules are reduced. A vacuum pump 505 for exhausting the vacuum vessel containing the beam limiting aperture is preferably, a noble pump, an ion pump, a non-evaporable Getter pump, or the like. Particularly, an evacuation system in which a turbo-molecular pump or a rotary pump is not operated produces an effect such that vibration of the emitter tip is reduced and an image of high resolution is obtained.

Before an element having light mass such as helium or hydrogen is extracted as an ion beam, an element having heavy mass such as neon, argon, krypton, xenon, or the like is extracted as an ion beam, and the extracted beam is emitted to the beam limiting aperture. The inventors of the present invention have found that, in such a manner, most of impurities adhered to the beam limiting aperture desorbs and, in the case of emitting an element having light mass such as helium or hydrogen as an ion beam, the impurity gas desorbed from the beam limiting aperture decreases. That is, the ion beam device with a stable ion beam current which enables sample observation having no brightness unevenness in an observation image is provided.

Figure 9:
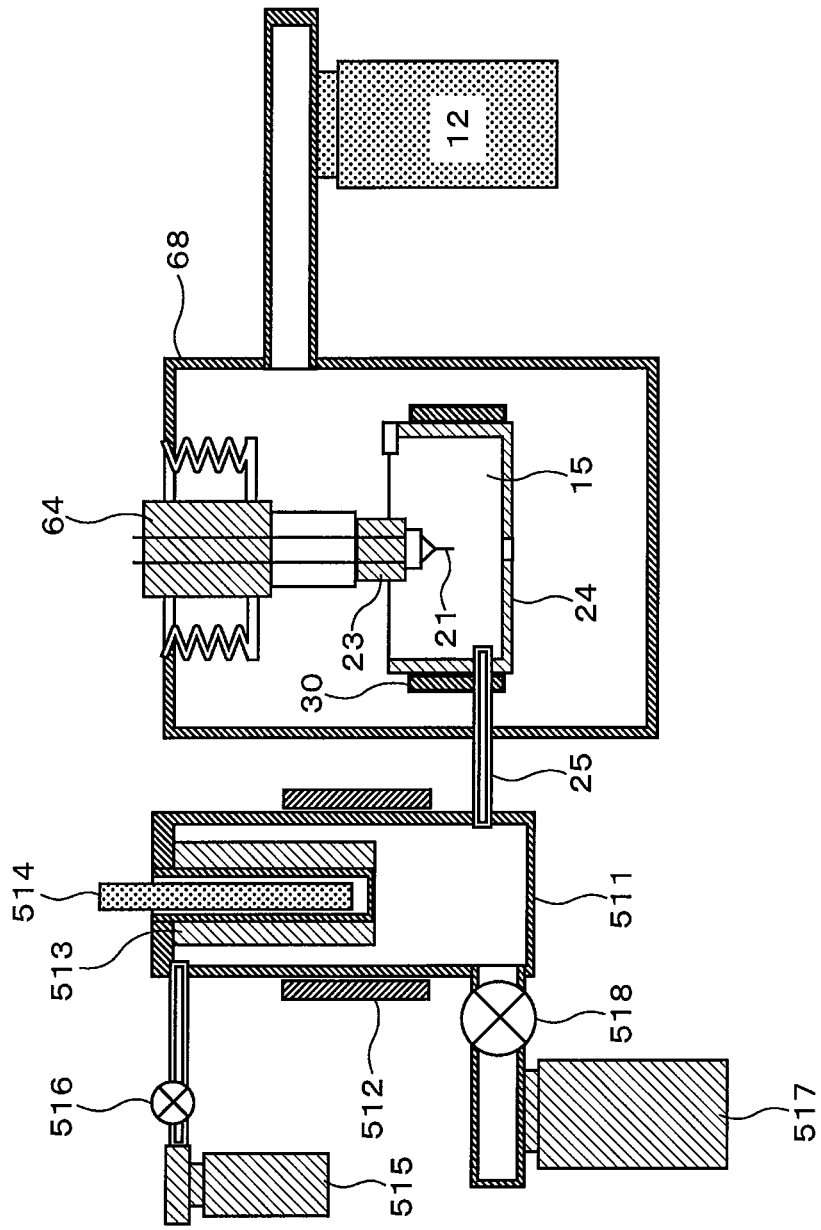
FIG. 9 is a schematic configuration diagram of an ionization material purifying mechanism in the first example of the ion microscope according to the invention.

Next, an example of paying attention to a phenomenon that the impurity in the ionization gas supplied to the periphery of the emitter tip makes the ion current unstable will be described with reference to FIG. 9. The purity of gas for supplying the ionization gas of the ion source is high, and the concentration of the impurity is a $1/10^5$ level. The inventors of the present invention have found a problem such that a small amount of impurity gas contained adheres to the end of the emitter tip and it makes the ion beam current unstable. Consequently, in the embodiment, as shown in FIG. 9, a buffer tank 511 for ion source purification containing a non-evaporable Getter material is provided. Around the buffer tank, a baking heater 512 capable of heating the entire buffer tank to about 200° C. and an activation heater 514 capable of heating a non-evaporable Getter material 513 to 500° C. are provided. An on-off valve 516 is provided between the buffer tank 511 and an ion material gas cylinder 515, and an off-off valve 518 is provided between the buffer tank 511 and a vacuum pump 517.

Next, a way of using the buffer tank for ion source purification will be described. First, the valve 518 between the buffer tank 511 and the vacuum pump 517 is opened to evacuate the buffer tank 511. After that, the entire buffer tank is heated at about 200° C. and the impurity gas adsorbed on the wall in the tank is exhausted.

Immediately after completion of heating, the non-evaporable Getter material 513 is heated to 500° C. The non-evaporable Getter material 513 is activated and gas molecules are adsorbed. In the case of using the ion material gas as inactive gas such as helium or argon, the gas is not adsorbed. Next, the valve between the buffer tank and the vacuum pump is closed and the valve 516 between the buffer tank and the cylinder gas 515 is opened. After a predetermined amount of the ion material gas is stored in the buffer tank, the valve 516 is closed. The impurity gas contained in the ion source material is adsorbed to the non-evaporable Getter material, and the ion source material gas is purified. The flow rate of the gas is controlled by a flow rate adjustment valve, and the resultant gas is introduced into the ion source. To be specific, the gas is introduced to the periphery of the emitter tip 21 in the ionization chamber. The impurity gas molecules adhered to the emitter tip 21 decrease dramatically, the ion beam current becomes stable, and an ion beam device which enables sample observation having no brightness unevenness in an observation image is provided.

In FIG. 7, the non-evaporable Getter material is used for the ionization chamber. In the embodiment, a Getter material 520 is disposed on the wall with which the gas released from the ion material gas supply pipe 25 collides. The heating heater 30 is provided for the outer wall of the ionization chamber.

Before introduction of the ionization gas, the non-evaporable Getter material 520 is heated and activated. The emitter tip is provided with a contamination preventing cover 521 so that the impurity gas released from the non-evaporable Getter material goes directly to the emitter tip 21. The ion source is cooled to very low temperature and, after that, the ionization gas is supplied from the ionization material gas supply pipe 25. In such a manner, the impurity gas molecules adhered to the emitter tip decrease dramatically, the ion beam current becomes stable, and the ion beam device which enables sample observation having no brightness unevenness in an observation image is provided.

Similarly, the inventors have found a problem such that the impurity gas flowing from the sample chamber vacuum vessel into the ion source vacuum vessel is adhered to the end of the emitter tip and makes the ion beam current unstable. The degree of vacuum is set to $10^{-7}$ Pa by a noble pump, an ion pump, and a non-evaporable Getter pump, and the impurity gas flowing in the ion source vacuum vessel is reduced as much as possible. As a result, the impurity gas molecules adhered to the emitter tip decrease dramatically, the ion beam current becomes stable, and the ion beam device which enables sample observation having no brightness unevenness in an observation image is provided.

The ion source is characterized by using ions released from the neighborhood of one atom at the end of the nano-pyramid. That is, the region from which the ion is emitted is narrow, and the ion light source is equal to a nanometer or less. Consequently, when the ion light source is focused on the sample at the same magnification and the reduction ratio is set to about $\frac{1}{2}$, the characteristic of the ion source can be utilized maximally. In the conventional gallium liquid metal ion source, the dimension of the ion light source is estimated as about 50 nm. Therefore, to realize the beam diameter of 5 nm on a sample, the reduction ratio has to be set to $\frac{1}{10}$ or less. In this case, the vibration of the emitter tip in the ion source is reduced to $\frac{1}{10}$ or less on a sample. For example, even when the emitter tip vibrates by 10 nm, the vibration of the beam spot on a sample is 1 nm or less.

Therefore, the influence of the vibration of the emitter tip on the beam diameter of 5 nm is light. In the example, the reduction ratio is relatively large and is about 1 to $\frac{1}{2}$. Accordingly, in the case where the reduction ratio is $\frac{1}{2}$, the vibration of 10 nm at the emitter tip becomes the vibration of 5 nm on the sample, and the vibration of the sample for the beam diameter is large. That is, to realize resolution of, for example, 0.2 nm, the vibration of the emitter tip has to be set to 0.1 nm or less at the maximum. The conventional ion source is not always satisfactory from the viewpoint of prevention of vibration at the end of the emitter tip.

To address the problem, in the present invention, the vibration preventing mechanism is provided as shown in FIG. 1. That is, the vibration preventing mechanism 19 prevents the vibration of the refrigerator 40 and the compressor 16 from being easily transmitted to the gas field ion source 1, the ion beam irradiation system column 2, and the sample chamber 3. The vibration of the compressor 16 is not easily transmitted to the pot 43 and the sample stage 10.

Further, as shown in FIG. 7, in the present invention, a vibration preventing mechanism using the superconductor block 75 is provided in a part of the emitter base mount 64 connected to the sapphire base 52. The ring-shaped electromagnet 72 is disposed around the superconductor block and is fixed to the vacuum vessel by the supporting member 73. First, the electromagnet is operated at a temperature at which a superconducting state is not obtained. As the emitter tip is cooled, the superconductor block is set to the superconducting state. Eventually, a so-called pinning effect of pinning the magnetic field from the electromagnet appears in the superconductor block. The superconductor block 75 and the ring-shaped electromagnet 72 are fixed in a non-contact manner, and vibration of the emitter tip attached to the end of the superconductor block 75 is prevented. The position of the ring-shaped electromagnet can be adjusted from the outside of the vacuum vessel, and the position of the emitter tip can be adjusted. The superconductor block and the ring-shaped electromagnet are not in contact with each other, and heat is not transmitted to the emitter tip by conduction. Consequently, an effect such that the emitter tip is maintained at extremely low temperature, and current from the emitter tip can be increased.

When the electromagnet of the present invention is constructed by a superconductor coil, the emitter tip is firmly fixed by a stronger magnetic field. In place of the ring-shaped electromagnet, a permanent magnet may be disposed around the superconductor block.

A plurality of electromagnets may be disposed around the superconductor block 75. By controlling the magnetic field intensity of the plurality of electromagnets, the position of the emitter tip base mount can be controlled.

As described above, according to the present invention, by generating an ion beam having a very small diameter and preventing vibration of the emitter tip, high-resolution observation of a sample surface can be realized. Since the air sealing in the ionization chamber is high in the ion source and the degree of vacuum is high on the outside of the ionization chamber, the ratio that the ion beam collides with gas in the vacuum and is neutralized is low. Therefore, an effect such that a sample can be irradiated with a high-current ion beam is produced. The number of helium gas molecules of high temperature which collide with the extraction electrode decreases, and the cooling temperature of the emitter tip and the extraction electrode can be decreased, and an effect such that a sample can be irradiated with a high-current ion beam is produced.

In the case where the nano-pyramid is damaged by an unexpected discharge phenomenon or the like, the emitter tip is heated for about 30 minutes (about 1,000° C.). By the operation, the nano-pyramid can be reproduced. That is, the emitter tip can be easily repaired. Consequently, a practical ion microscope can be realized.

The distance between the tip of the objective lens 8 and the surface of the sample 9 is called a work distance. When the work distance is set to a value less than 2 mm in the ion beam device, the resolution becomes less than 0.2 nm, and the super-resolution is realized. Since an ion of gallium or the like is used conventionally, there is a concern such that sputter particles from the sample contaminate the objective lens and the normal operation is disturbed. The ion microscope according to the present invention has the reduced concern and can realize the super-resolution.

In the gas field ion source and the ion beam device according to the present invention as described above, the vibration from the cooling mechanism is not easily transmitted to the emitter tip. Since the mechanism of fixing the emitter base mount is provided, the vibration of the emitter tip is prevented, and high-resolution observation is made possible.

Further, in the gas field ion source of the present invention, by sufficiently reducing the hole 27 in the extraction electrode 24, the sealing performance of the ionization chamber increases, and the high gas pressure in the ionization chamber can be realized. Consequently, high-current ion emission is realized.

In the gas field ion source of the present invention, the heat transfer path extending from the cooling mechanism 4 to the emitter tip 21 is provided, so that extremely low temperature of the emitter can be realized. Consequently, a high-current ion beam is obtained. In the gas field ion source of the invention, the extraction electrode has a fixed structure, the emitter tip has a movable structure, and the emitter tip and the extraction electrode are connected to each other via a deformable material. Thus, easier adjustment of the axis of the emitter tip and the higher current of ions can be realized.

Figure 10:
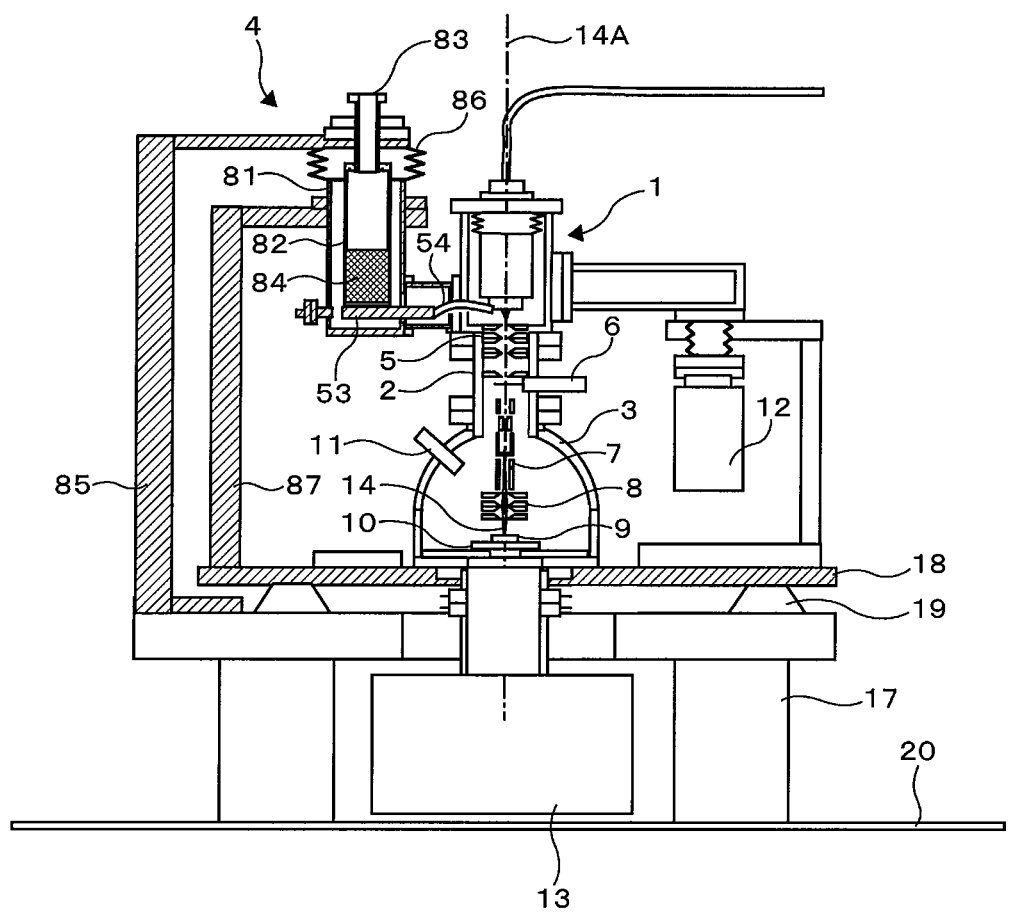
FIG. 10 is a schematic configuration diagram of a second example of an ion microscope according to the invention.

With reference to FIG. 10, a second example of the ion microscope according to the present invention will be described. The ion microscope of the second example is different from that of the second example with respect to the configuration of the cooling mechanism 4 for the gas field ion source 1. The cooling mechanism 4 will now be described. The cooling mechanism 4 of the second example has a vacuum chamber 81 and a cooling tank 82. The vacuum chamber 81 is constructed by a vacuum vessel having therein a cooling tank 82. The vacuum chamber 81 and the cooling tank 82 are not in contact with each other. Therefore, vibration and heat are hardly transmitted between the vacuum chamber 81 and the cooling tank 82.

The cooling tank 82 has an evacuation port 83. The evacuation port 83 is connected to a not-shown vacuum pump. To the cooling tank 82, the cooling conduction rod 53 made of copper is connected in a manner similar to the example 1 shown in FIG. 3. Like the cooling mechanism shown in FIGS. 3 and 4, also in the second example, a heat transfer path is constructed by the emitter tip 21, the sapphire base 52, the copper stranded wire 54, the cooling conduction rod 53, and the cooling tank 82. Similarly, a heat transfer path is constructed by the extraction electrode 24, the sapphire base 55, the copper stranded wire 56, the cooling conduction rod 53, and the cooling tank 82. The copper stranded wire 54 has high thermal conductivity. The material is not limited to copper but any member such as a silver stranded wire can be employed as long as it has flexibility and does not easily transfer vibration.

First, liquid nitrogen is introduced into the cooling tank 82 to evacuate the inside of the cooling tank via the evacuation port 83. It decreases the temperature of the liquid nitrogen. The liquid nitrogen solidifies and becomes solid nitrogen 84.

In the example, after the liquid nitrogen solidifies completely, the vacuum pump connected to the evacuation port 83 is stopped, and an ion beam is generated by the emitter tip 21. When the vacuum pump is stopped, no mechanical vibration of the vacuum pump occurs.

During generation of an ion beam, heat is transmitted via the heat transfer path connecting the emitter tip 21, the extraction electrode 24, and the cooling tank 82. The solid nitrogen in the cooling tank 82 sublimes or melts. In the example, to cool the emitter tip 21 and the extraction electrode 24, latent heat such as sublimation heat or melting heat can be used.

Before all of the solid nitrogen becomes liquid and boiling starts, the vacuum pump connected to the evacuation port 83 is operated to evacuate the cooling tank 82. By the operation, the temperature of the liquid nitrogen decreases and solidifies. After all of the liquid nitrogen solidifies, the vacuum pump connected to the evacuation port 83 is stopped. By repeating the operation, the temperature of nitrogen in the cooling tank 82 can be always maintained at around the melting point of nitrogen. The temperature of the nitrogen in the cooling tank 82 is always lower than the boiling point. Therefore, vibration caused by boiling of the liquid nitrogen does not occur. In such a manner, the cooling mechanism of the example does not make mechanical vibration occur. Consequently, high-resolution observation can be made.

In the example, to control the operation of the vacuum pump connected to the evacuation port 83, the temperature of nitrogen in the cooling tank 82 is measured. For example, when the temperature of nitrogen becomes predetermined temperature higher than the melting point, the operation of the vacuum pump connected to the evacuation port 83 is started. When the temperature of nitrogen becomes predetermined temperature lower than the melting point, the operation of the vacuum pump connected to the evacuation port 83 is stopped. In place of the temperature of nitrogen in the cooling tank 82, the degree of vacuum may be measured and the operation of the vacuum pump connected to the evacuation port 83 may be controlled according to the measured degree of vacuum.

In the example, by evacuating the cooling tank 82, the liquid nitrogen in the cooling tank 82 is cooled. However, gas-phase nitrogen is exhausted, and nitrogen decreases with time. By using the refrigerator, the solid nitrogen in the cooling tank 82 may be cooled. As a result, decrease in nitrogen can be prevented. Preferably, during operation of the refrigerator, generation of an ion beam by the gas field ion source 1 is stopped. That is, with the ion source of the embodiment, an ion microscope which realizes reduction in mechanical vibration and enables high-resolution observation is provided.

Over the device stand 17 mounted on the floor 20, the base plate 18 is disposed via the vibration preventing mechanism 19. The gas field ion source 1, the column 2, and the sample chamber 3 are supported by the base plate 18.

The device stand 17 is provided with a supporting pillar 85. By the supporting pillar 85, the evacuation port 83 of the cooling tank 82 is supported. The supporting pillar 85 and the vacuum chamber 81 are connected to each other via a bellows 86. The base plate 18 is provided with a supporting pillar 87. The vacuum chamber 81 is supported by the supporting pillar 87 and is simultaneously hanged by the supporting pillar 85 via the bellows 86.

The bellows 86 reduces transmission of high-frequency vibration. Therefore, even when vibration from the floor 20 is transmitted to the supporting pillar 85 via the device stand 17, it is reduced by the bellows 86. Therefore, the vibration from the floor 20 is hardly transmitted to the vacuum chamber 81 via the supporting pillar 85. The vibration from the floor 20 is transmitted to the device stand 17. However, the vibration from the floor 20 is hardly transmitted to the base plate 18 by the vibration preventing mechanism 19. Therefore, the vibration from the floor 20 is hardly transmitted to the vacuum chamber 81 via the supporting pillar 87.

As described above, in the example, the vibration from the floor 20 is not transmitted to the vacuum chamber 81 and the cooling tank 82. Therefore, the vibration from the floor 20 is not transmitted to the gas field ion source 1, the ion beam radiation system column 2, and the sample chamber 3 via the cooling mechanism 4.

In some conventional techniques, vibration of a tank which stores liquid nitrogen is considered. However, transmission of the vibration of the tank to the vacuum chamber and an influence of the vibration on an ion beam are not sufficiently examined. According to the present invention, the vibration of the cooling tank 82 is not easily transmitted to the vacuum chamber 81. Since the vibration from the floor 20 via the vacuum chamber 81 and the cooling tank 82 is reduced, the high-resolution ion beam microscope is provided.

Although nitrogen is charged in the cooling tank 82 in the example, neon, oxygen, argon, methane, hydrogen, or the like may be used except for nitrogen. Particularly, in the case of using solid neon, low temperature which is suitable to make a high-current helium or hydrogen ion beam can be realized.

Figure 11:
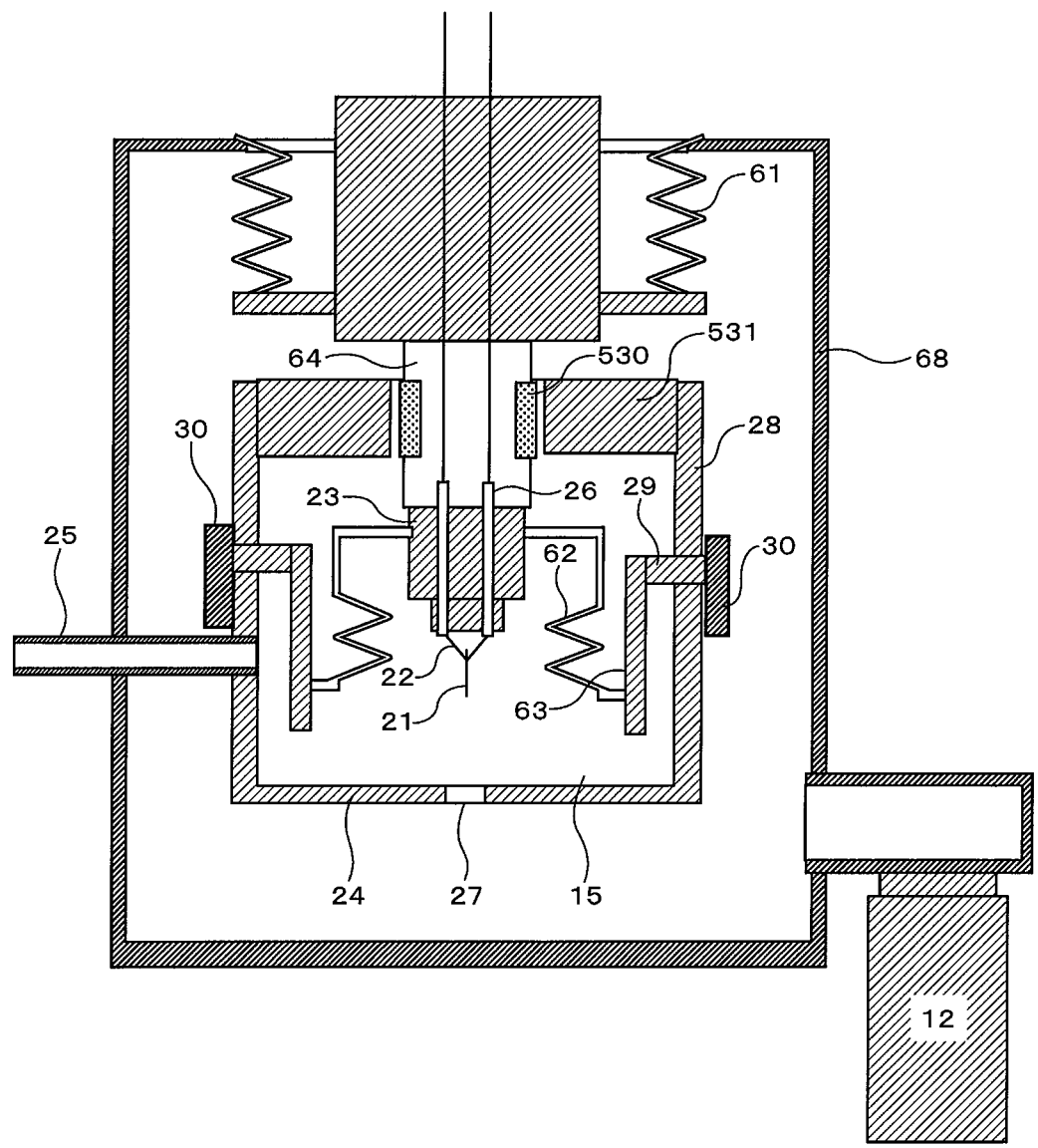
FIG. 11 is a schematic structure diagram of a vibration preventing mechanism of the gas field ion source in the second example of the ion microscope according to the invention.

FIG. 11 shows the emitter tip vibration preventing mechanism in the embodiment. In the embodiment, a vibration preventing mechanism in which a plurality of permanent magnets 530 are buried is provided in a part of the emitter base mount 64. A superconductor block 531 is disposed around the permanent magnets 530 and fixed to the ionization chamber side wall 28. As the emitter tip, that is, the ionization chamber is cooled, the superconductor block 531 is set to a superconducting state. Eventually, a so-called pinning effect of pinning the magnetic field from the electromagnet 530 appears in the superconductor block. The superconductor block 531 and the permanent magnet 530 are fixed in a non-contact manner, and vibration of the emitter tip attached to the end of the emitter base mount 64 is prevented. Since the superconductor block is connected to the ionization chamber side wall 28 of extremely low temperature, the vibration preventing mechanism does not add a large amount of heat to the emitter tip. Consequently, the emitter tip is maintained at extremely low temperature, and there is an effect such that an ion beam current from the emitter tip can be increased.

In the embodiment, by burying the superconductor block in the emitter base mount 64 and disposing a permanent magnet on the ionization chamber side wall 28, a similar effect is obtained.

Although not shown, a magnetic shield is disposed on the emitter tip mount 23 so that the magnetic field from the permanent magnet does not exert an influence on an ion beam orbit. As a result, both emitter tip vibration prevention and no influence on the orbit of the ion beam can be realized.

As described above, in the gas field ion source and the ion beam device of the present invention, vibration from the cooling mechanism is not easily transmitted to the emitter tip. Since the emitter base mount fixing mechanism is provided, vibration of the emitter tip is prevented, and high-resolution observation is realized.

Figure 12:
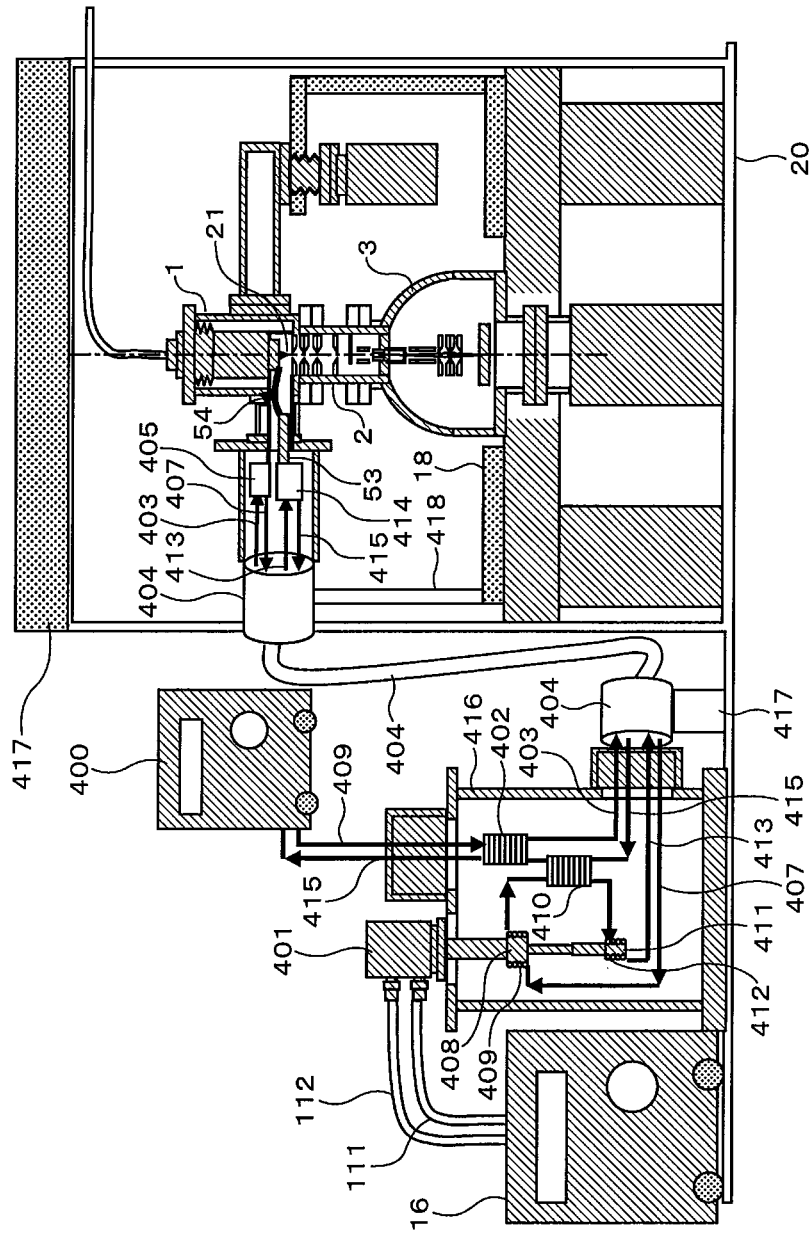
FIG. 12 is a schematic configuration diagram of a third example of the ion microscope according to the invention.

With reference to FIG. 12, a third example of the ion microscope according to the present invention will be described. The ion microscope of the third example is different from that of the first example shown in FIG. 1 with respect to the configuration of the cooling mechanism 4 for the gas field ion source 1. The cooling mechanism 4 will now be described. The cooling mechanism 4 of the third example is of a helium circulation type.

The cooling mechanism 4 of the example cools helium gas as a refrigerant by using a GM-type refrigerator 401 and heat exchangers 402, 405, 410, and 414 and makes the gas circulate by a compressor unit 400. The helium gas having 0.9 Mpa and a temperature of 300K at normal temperature which is compressed by a compressor 403 flows in the heat exchanger 402 via a pipe 409, exchanges heat with a low-temperature helium gas which is returning and will be described later, and is cooled to a temperature of about 60K. The cooled helium gas is transported via a pipe 403 in an insulated transfer tube 404 and flows in the heat exchanger 405 disposed near the gas field ion source 1. A heat conductor 406 thermally integrated with the heat exchanger 405 is cooled to temperature of about 65K and cools the above-described radiation shield and the like. The heated helium gas flows out from the heat exchange 405, flows, via the pipe 407, in the heat exchanger 409 thermally integrated with a first cooling stage 408 in the GM-type refrigerator 401, is cooled to temperature of about 50K, and flows in the heat exchanger 410. The helium gas exchanges heat with a low-temperature helium gas which is returning and will be described later, and is cooled to a temperature of about 15K. After that, the cooled gas flows in a heat exchanger 412 which is thermally integrated with a second cooling stage 402 in the GM-type refrigerator 401, is cooled to temperature of about 9K, is transported via a pipe 413 in the transfer tube 404, flows in the heat exchanger 414 disposed near the gas field ion source 1, and cools the cooling conduction rod 53 as a heat conductor thermally connected to the heat exchanger 414 to a temperature of about 10K. The helium gas heated by the heat exchanger 414 sequentially flows in the heat exchangers 410 and 402 via a pipe 415, exchanges heat with the above-described helium gas to a temperature of about 275K at almost normal temperature, and the resultant gas is collected by the compressor unit 400 via the pipe 415. The above-described low-temperature part is housed in a vacuum insulation vessel 416 and, although not shown, is adiabatically connected to the transfer tube 404. Although not shown, the low-temperature part prevents heat invasion by radiation heat from a room-temperature part by a radiation shield plate, a multilayer insulation material, or the like in the vacuum insulation vessel 416.

The transfer tube 404 is firmly fixed by the floor 20 or a supporting member 417 mounted on the floor 20. Although not shown, the pipes 403, 407, 413, and 415 fixedly supported in the transfer tube 404 by a heat insulating member made of glass fiber plastic as a heat insulating material having low thermal conductivity are also fixedly supported by the floor 20. Near the gas field ion source 1, the transfer tube 404 is fixedly supported by the base plate 18. Similarly, although not shown, the pipes 403, 407, 413, and 415 fixedly supported in the transfer tube 404 by a heat insulating member made of glass fiber plastic as a heat insulating material having low thermal conductivity are also fixedly supported by the base plate 18.

The cooling mechanism has cold generating means which generates cold by making first high-pressure gas generated by the compressor unit 16 expand, and a cooling mechanism for performing cooling by the cold of the cold generating means and cooling a member to be cooled by a helium gas as a second moving refrigerant which is circulated by the compressor unit 400.

The cooling conduction rod 53 is connected to the emitter tip 21 via the deformable copper stranded wire 54 and the sapphire base. As a result, cooling of the emitter tip 21 is realized. In the embodiment, the GM-type refrigerator is a cause of vibrating the floor. However, the gas field ion source 1, the ion beam irradiation system column 2, the vacuum sample chamber 3, and the like are mounted apart from the GM refrigerator. Further, the pipes 403, 407, 413, and 415 coupled to the heat exchangers 405 and 414 mounted near the gas field ion source 1 are firmly fixedly supported by the floor 20 and the base 18 which hardly vibrate, and do not vibrate. Moreover, they are vibration-insulated from the floor, so that the system having an extremely little transmission of mechanical vibration is obtained.

However, to maximally utilize the characteristic of the ion source, the vibration preventing mechanism as shown in FIG. 11 is provided. Permanent magnets are disposed in a plurality of places in the periphery of the emitter base mount, and a superconductor block is disposed around the permanent magnets. The superconductor block is fixed to the ionization chamber side wall. In this case, the superconductor block enters a superconducting state as the ionization chamber is cooled.

First, the emitter tip position is adjusted at a temperature at which the superconducting state is not obtained. As the emitter tip is cooled, the superconductor block is set to the superconducting state. Eventually, a so-called pinning effect of pinning the magnetic field from the permanent magnets appears in the superconductor block. The emitter tip mount in which the permanent magnets are disposed is fixed in a noncontact manner, and vibration of the emitter tip attached to the end of the emitter tip mount is prevented. Since the superconductor block is connected to the ionization chamber side wall 28 of extremely low temperature, the vibration preventing mechanism does not add a large amount of heat to the emitter tip. Consequently, the emitter tip is maintained at extremely low temperature, and there is an effect such that an ion beam current from the emitter tip can be increased. By disposing the superconductor block in the emitter base mount, disposing permanent magnets around the superconductor block, and fixing the permanent magnets to the ionization chamber side wall, a similar effect is obtained.

As described above, in the gas field ion source and the ion beam device of the present invention, vibration from the cooling mechanism is not easily transmitted to the emitter tip. Since the emitter base mount fixing mechanism is provided, vibration of the emitter tip is prevented, and high-resolution observation is realized.

Further, the inventors of the present invention found out that sound of the compressor 16 or 400 makes the gas field ion source 1 vibrate and it deteriorates the resolution. Consequently, in the example, a cover 417 for spatially separating the compressor and the gas field ion source is provided. By the cover 417, the influence of vibration caused by the sound of the compressor can be reduced. As a result, high-resolution observation is realized. Also in the examples shown in FIGS. 1, 7, and 8, a cover may be provided in order to reduce the influence of vibration caused by the sound of the compressor.

Although the second helium gas is circulated by using the helium compressor 400 in the embodiment, a similar effect is produced by, although not shown, making the pipes 111 and 112 of the helium compressor 16 communicated via a flow adjustment valve and making the pipes 409 and 416 communicated via a flow adjustment valve, supplying circulation helium gas as a second helium gas, which is a part of the helium gas of the helium compressor 16 into the pipe 409, and collecting the gas by the helium compressor 16 via the pipe 416.

Although the GM-type refrigerator 40 is used in the example, in place of it, a pulse tube refrigerator or Stirling refrigerator may be used. Although the refrigerator has two cooling stages in the example, the refrigerator may have a single cooling stage. The number of cooling stages is not limited. For example, when a helium circulation refrigerator using small-sized Stirling refrigeration having one cooling stage, and whose lowest cooling temperature is 50K is employed, a compact, low-cost ion beam device can be realized. In this case, neon gas or hydrogen may be used in place of the helium gas.

Figure 13A:
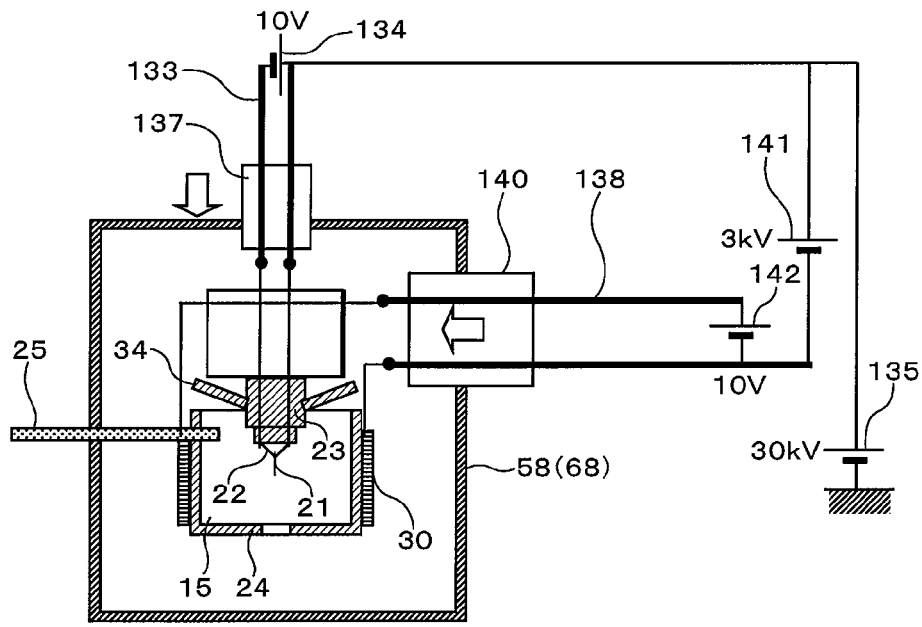
FIG. 13A is a diagram for explaining operation of a mechanism of cutting a wire (connected state) in the periphery of an ionization chamber of a gas field ion source in a fourth example of the ion microscope according to the invention.
Figure 13B:
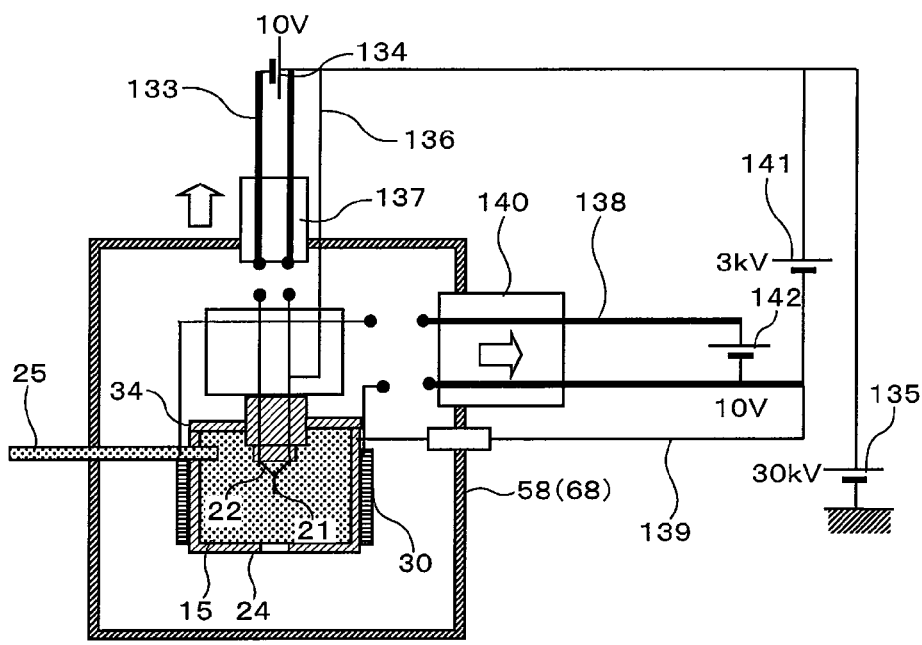
FIG. 13B is a diagram for explaining operation of a mechanism of cutting a wire (cut state) in the periphery of the ionization chamber of the gas field ion source in the fourth example of the ion microscope according to the invention.

With reference to FIGS. 13A and 13B, a fourth example of the ion microscope according to the present invention will be described. The structure of an ionization chamber of a gas field ion source will now be explained. The embodiment is characterized by a wiring structure of the ionization chamber. The gas field ion source has a heating power source 134 for heating the emitter tip 21, a high-voltage power source 135 for supplying acceleration voltage to accelerate ions to the emitter tip 21, an extraction power source 141 for supplying extraction voltage to extract the ions to the extraction electrode 24, and a heating power source 142 for heating the resistive heater 30.

The heating power sources 134 and 143 may be set to 10V, the high-voltage power source 135 may be set to 30 kV, and the extraction power source 141 may be set to 3 kV.

As shown in FIG. 13B, the filament 22 and the high-voltage power source 135 are connected via a thick line 133 made of copper and a thin line 136 made of a high-temperature superconductor material. The filament 22 and the heating power source 134 are connected to each other via the thick line 133 made of copper. The resistive heater 30 and the heating power source 142 are connected to each other via a thin line 138 made of copper and a thin line 139 made of a high-temperature superconductor material. The extraction electrode 24 and the resistive heater 30 have the same potential.

The thick line 133 made of copper is provided with a cutting mechanism 137. The cutting mechanism 137 has a movable mechanism and moves between two positions; a cutting position where the thick line 133 made of copper is cut from the filament 22, and a connection position where the thick line 133 made of copper is connected to the filament 22. The thick line 138 made of copper is provided with a cutting mechanism 140. The cutting mechanism 140 has a movable mechanism and moves between two positions; a cutting position where the thick line 138 made of copper is cut from the resistive heater 30, and a connection position where the thick line 138 made of copper is connected to the resistive heater 30. FIG. 13A shows a state where both of the cutting mechanisms 137 and 140 are in the connection positions, and FIG. 13B shows a state where both of the cutting mechanisms 137 and 140 are in the cutting positions. When the cutting mechanisms 137 and 140 are in the cutting positions, heat can be prevented from flowing in the filament 22 and the extraction power source 141 via the thick lines 133 and 138 made of copper, respectively. The cutting mechanisms 137 and 140 can be operated from the outside of the vacuum vessel.

In the example, an on-off valve for opening/closing the ionization chamber 15 is attached. The on-off valve has a cover member 34. FIG. 13A shows a state where the cover member 34 is open, and FIG. 13B shows a state where the cover member 34 is closed.

The operation of the gas field ion source of the example will be described. First, as shown in FIG. 13A, coarse exhaust is performed in a state where the cover member 34 of the ionization chamber 15 is open. Since the cover member 34 of the ionization chamber 15 is open, the coarse exhaust of the ionization chamber 15 completes in short time.

Subsequently, by heating the extraction electrode 24, the side wall 28, and the top plate 29 by the resistive heater 30 on the outside of the side wall of the ionization chamber 15, degasifying process is performed. After completion of the degasifying process, as shown in FIG. 13B, the cutting mechanism 140 is moved to the cutting position. In such a manner, heat is prevented from flowing in the ionization chamber 15 via the thick line 138 made of copper.

The cover member 34 of the ionization chamber 15 is closed and helium is supplied from the gas supply pipe 25. High voltage is supplied to the emitter tip 21 and the extraction voltage is applied to the extraction electrode 24. When an ion beam is generated from the end of the emitter tip 21, the cutting mechanism 137 is moved to the cutting position. In such a manner, heat is prevented from flowing in the ionization chamber 15 via the thick line 133 made of copper. When the cutting mechanism 137 is in the cutting position, the acceleration voltage from the high-voltage power source 135 is not applied to the filament 22 via the thick line 133 made of copper but is applied to the filament 22 via the thin line 137 made of high-temperature superconductor material. When the cutting mechanism 140 is in the cutting position, the extraction voltage from the extraction power source 141 is not applied to the extraction power source 141 via the thick line 138 made of copper but is applied to the filament 22 via the thin line 139 made of high-temperature superconductor material. The filament 22 and the extraction power source 141 are always connected to the thin lines 136 and 139 made of high-temperature superconductor material, respectively. Therefore, there is the possibility that heat flows in the ionization chamber 15 via the thin lines 136 and 138 made of stainless steel. However, the section of each of the thin lines 136 and 139 made of stainless steel is sufficiently small, so that the amount of heat transmitted via the thin lines 136 and 139 made of high-temperature superconductor material is sufficiently small.

With the wiring structure of the example, the heat inflow from the copper wire to the ionization chamber 15 can be avoided. Consequently, the emitter tip and the extraction electrode can be held at desired temperature. That is, improvement in brightness of the ion source and the higher current of the ion beam can be achieved. Further, high-resolution observation is realized.

Although the thick line made of copper is used in the embodiment, an ultrafine wire made of high-temperature superconductor material may be used. In this case, the electric resistance is extremely low at extremely low temperature, so that the ultrafine wire is sufficient to pass filament current. An effect is produced such that heat inflow to the ionization chamber 15 can be avoided also in the case where the wire is not disconnected by the cutting mechanism.

In the example, by providing the ionization chamber 15 with the cover member 34, even when the dimension of the hole in the extraction electrode is decreased, the conductance at the time of coarse vacuuming can be increased. By decreasing the dimension of the hole in the extraction electrode, the sealing performance of the ionization chamber 15 can be increased. It realizes higher vacuum in the ionization chamber 15 and a higher-current ion beam can be obtained.

The wiring structure described above can also be applied to the examples shown in FIGS. 1, 10, and 12.

The above-described scan ion microscope obtains a scan ion image by performing scanning with an ion beam by the ion beam scanning electrode. In this case, however, the ion beam tilts when it passes through the ion lens, so that the ion beam is distorted. There is consequently a problem such that the beam diameter is large. In place of performing scanning with the ion beam, the sample stage may be mechanically moved for scanning in two orthogonal directions. In this case, by detecting secondary particles released from a sample and performing brightness modulation on the secondary particles, a scan ion image can be obtained on image display means of a computer processor. That is, high-resolution observation of less than 0.5 nm of a sample surface is realized. In this case, an ion beam can be always held in the same direction with respect to the objective lens, so that distortion of the ion beam can be made relatively small.

It can be realized, for example, by using a sample stage obtained by combining first and second stages. The first stage is a four-axis movable stage which can move by a few centimeters, and can move, for example, in two perpendicular directions (X and Y directions) of a plane and a height direction (Z direction) and can move obliquely (T direction). The second stage is a biaxial movable stage which can move by a few micrometers and can move, for example, in two perpendicular directions (X and Y directions) of a plane.

For example, the sample stage is constructed by disposing the second stage driven by a piezo element on the first stage driven by an electric motor. In the case of retrieving a sample observation position or the like, the sample is moved by using the first stage. In the case of high-resolution observation, the sample is finely moved by using the second stage. With the configuration, the ion microscope capable of performing ultrahigh resolution observation is provided.

The scan ion microscope has been described above as an example of the ion beam device of the present invention. However, the ion beam device of the invention is not limited to the scan ion microscope but can also be applied to a transmission ion microscope and an ion beam machining device.

Next, the vacuum pump 12 for evacuating the gas field ion source will be described. Preferably, the vacuum pump 12 is constructed by a combination of a non-evaporable Getter pump and an ion pump, a combination of a non-evaporable Getter pump and a noble pump, or a combination of a non-evaporable Getter pump and an excel pump. A sublimation pump may also be employed. It has been found that, by using any of such pumps, the influence of vibration of the vacuum pump 12 can be reduced, and high-resolution observation is realized. It has been found that, in the case of using a turbo molecule pump as the vacuum pump 12, the vibration of the turbo molecule pump sometimes disturbs observation of a sample with an ion beam. It has also been found that even when a turbo molecule pump is attached to the vacuum vessel of any of the ion beam devices, by stopping the turbo molecule pump at the time of observing a sample with an ion beam, high-resolution observation is possible. That is, in the present invention, although a main evacuation pump at the time of observation of a sample with an ion beam is constructed by a combination of a non-evaporable Getter pump and an ion pump, a combination of a non-evaporable Getter pump and a noble pump, or a combination of a non-evaporable Getter pump and an excel pump. Even if a turbo molecule pump is attached, the object of the present invention is not disturbed.

The non-evaporable Getter pump is a vacuum pump made of an alloy which adsorbs gas when activated by heating. In the case of using helium as the ionization gas of the gas field ion source, a relatively large amount of helium exists in the vacuum vessel. However, the non-evaporable Getter pump hardly exhausts helium. That is, the Getter surface is not saturated by absorption gas molecules. Consequently, the operation time of the non-evaporable Getter pump is sufficiently long. This is an advantage in the case of combining the helium ion microscope and the non-evaporable Getter pump. An effect such that since the impurity gas in the vacuum vessel decreases, the ion release current becomes stable is also produced.

Although the non-evaporable Getter pump exhausts residual gas except for helium at high exhaust speed, helium remains in the ion source only by the exhaust. Due to this, the degree of vacuum becomes insufficient, and the gas field ion source does not operate normally. To address it, an ion pump or noble pump having high speed of exhaust of inactive gas is used in combination with the non-evaporable Getter pump. When only an ion pump or noble pump is used, exhaust speed is insufficient. According to the present invention, by combining the non-evaporable Getter pump and the ion pump or noble pump, the compact, low-cost vacuum pump 12 can be obtained. As the vacuum pump 12, a pump obtained by combining a Getter pump or a titanium sublimation pump which evaporates metal such as titanium by heating, adsorbs gas molecules by a metal film, and evacuates may also be used.

Although the sufficient performance of the ion microscope is not obtained due to insufficient consideration on the mechanical vibration in the conventional techniques, the present invention realizes reduction in the mechanical vibration and provides the gas field ion source and the ion microscope by which high-resolution observation can be performed.

Next, the sample chamber evacuation pump 13 for evacuating the sample chamber 3 will be described. As the sample chamber evacuation pump 13, a Getter pump, a titanium sublimation pump, a non-evaporable Getter pump, an ion pump, a noble pump, an excel pump, or the like may be used. It has been found that, by using any of such pumps, the influence of vibration of the sample chamber evacuation pump 13 can be reduced, and high-resolution observation is realized.

A turbo molecule pump may be used as the sample chamber evacuation pump 13. However, it costs to realize a structure of lessening vibration of a device. It has been found that even when a turbo molecule pump is attached in a sample chamber, by stopping the turbo molecule pump at the time of observing a sample with an ion beam, high-resolution observation can be made. In the present invention, a main evacuation pump in the sample chamber at the time of observation of a sample with an ion beam is constructed by a combination of a non-evaporable Getter pump and an ion pump, a combination of a non-evaporable Getter pump and a noble pump, or a combination of a non-evaporable Getter pump and an excel pump. Even if a turbo molecule pump is attached as a device component and used for coarse vacuuming from atmosphere, the object of the present invention is not disturbed.

The scanning electron microscope can realize resolution of 0.5 nm or less by using the turbo molecule pump relatively easily. However, in an ion microscope using a gas field ion source, the reduction ratio of an ion beam from the ion light source to a sample is relatively large and is about 1 to 0.5. Consequently, the characteristic of the ion source can be utilized maximally. However, the vibration of the ion emitter is reproduced on a sample without being hardly reduced, so that a careful measure which is more than a vibration measure in a conventional scanning electron microscope or the like is necessary.

In the conventional techniques, the fact that the vibration of the sample chamber evacuation pump exerts an influence on the sample stage is considered, but the fact that the vibration of the sample chamber evacuation pump exerts an influence even on the ion emitter is not considered. The inventors of the present invention therefore have found out that the vibration of the sample chamber evacuation pump exerts a serious influence on the ion emitter. The inventors of the present invention have thought that it is preferable to use, as the sample chamber evacuation pump, a non-vibration-type vacuum pump as a main pump such as a Getter pump, a titanium sublimation pump, a non-evaporable Getter pump, an ion pump, a noble pump, or an excel pump. With the main pump, the vibration of the ion emitter is reduced, and high-resolution observation is realized.

There is the possibility that the compressor unit (compressor) for the gas of the refrigerator or the compressor unit (compressor) for making helium circulate used in the example becomes the source of noise. The noise sometimes makes the ion microscope vibrate. Consequently, according to the present invention, by providing the gas compressor unit (compressor) with a cover as in the example shown in FIG. 9, noise which is generated by the gas compressor unit is prevented from being transmitted to the outside. In place of the cover, a sound shield plate may be provided. The compressor unit (compressor) may be mounted in another room. With the configuration, vibration caused by sound is reduced, and high-resolution observation is realized.

A non-evaporable Getter material may be disposed in the ionization chamber. With the configuration, the inside of the ionization chamber is in high vacuum and very-stable ion emission is realized. Alternately, the non-evaporable Getter material or hydrogen storing alloy is allowed to adsorb hydrogen and is heated. By using hydrogen released by the heating as ionization gas, it becomes unnecessary to supply gas from the gas supply pipe 25. A compact and safe gas supply mechanism can be realized.

A non-evaporable Getter material may be disposed in the gas supply pipe 25. Impurity gas in the gas supplied via the gas supply pipe 25 is reduced by the non-evaporable Getter material. Consequently, ion emission current becomes stable.

In the invention, helium or hydrogen is used as the ionization gas supplied to the ionization chamber 15 via the gas supply pipe 25. As the ionization gas, neon, oxygen, argon, krypton, xenon, or the like may also be used. In particular, in the case o suing neon, oxygen, argon, krypton, xenon, or the like, an effect such that a sample processing device or a sample analyzing device is provided is produced.

A mass spectrometer may be provided in the sample chamber 3. The mass spectrometer conducts mass analysis on secondary ions emitted from a sample or energy analysis on Auger electrons emitted from a sample. The analysis facilitates sample element analysis, and sample observation and the element analysis by the ion microscope can be performed by a single device.

In the ion microscope of the present invention, by applying high negative voltage to the emitter tip, electrons can also be extracted from the emitter tip. A sample is irradiated with an electron beam and an X-ray or Auger electron emitted from the sample is detected. The detection facilitates sample element analysis, and sample observation and the element analysis of high resolution by the ion microscope can be performed by a single device.

In this case, an ion image having a resolution of 1 nm or less and an element analysis image may be displayed side by side or overlappingly. By the display, the sample surface can be preferably subjected to characterization.

When a composite lens obtained by combining a magnetic-field lens and an electrostatic lens is used as the objective lens for focusing an electron beam, an electron beam can be focused to a high-current beam having a very small diameter, so that an element analysis of high-spatial resolution and high sensitivity is realized.

Although disturbance of an external magnetic field is not considered in the conventional ion beam device, the inventors of the present invention have found that, in the case of focusing an ion beam to a value which is less than 0.5 nm, it is effective to shield the magnetic field. Consequently, by forming the gas field ion source, the ion beam irradiation system, and the vacuum chamber in the sample chamber of pure iron or permalloy, ultrahigh resolution can be achieved. A plate as a magnetic shield may be inserted in the vacuum vessel.

The inventors of the present invention have found that when the ion beam acceleration voltage is set to 50 kV or higher, the structure dimensions of a semiconductor sample can be measured with high precision. Since the sputter yield of a sample with an ion beam decreases, the degree of destroying the structure of the sample becomes low, and the dimensional measurement precision improves. In particular, when hydrogen is used as ionization gas, the sputter yield decreases, and the precision of the dimensional measurement improves.

As described above, the present invention provides an analyzer suitable for measuring structural dimensions of a sample with an ion beam and a length measuring device or an inspection device using an ion beam.

Since the depth of focus of an image obtained in the present invention is deeper than that in measurement with a conventional electron beam, measurement with higher precision can be performed. Particularly, when hydrogen is used as the ionization gas, the amount of etching the sample surface is smaller and measurement with higher precision can be performed.

The present invention provides a length measuring device or an inspection device using an ion beam suitable to measure structural dimensions of a sample.

In place of a device of forming a section by processing a sample with an ion beam and observing the section by an electron microscope, the invention can provide a device of forming a section by processing a sample with an ion beam and observing the section by an ion microscope and a section observing method.

The invention can provide a device capable of performing sample observation by an ion microscope, sample observation by an electron microscope, and an element analysis by a single device, an analyzing device for observing and analyzing a defect, a foreign matter, or the like, and an inspection device.

The ion microscope realizes ultrahigh resolution. However, conventionally, the influence on manufacture of destruction of a surface of a semiconductor sample of ion beam irradiation in the case of using an ion beam device as a device of measuring structural dimensions in a process of manufacturing a semiconductor sample or an inspection device is not considered in comparison with the case of electron beam irradiation. For example, when the energy of an ion beam is set to less than 1 keV, the ratio that a sample becomes modified is low and, in comparison with the case where energy of an ion beam is set to 20 keV, the precision of dimensional measurement improves. In this case, an effect such that the cost of the device becomes also lower is produced. On the contrary, in the case where acceleration voltage is 50 kV or higher, the observation resolution can be made higher than that in the case where the acceleration voltage is low.

The inventors of the present invention found that by setting the ion beam acceleration voltage to 200 kV or higher, decreasing the beam diameter to 0.2 nm or less, irradiating a sample with the resultant ion beam, and energy-analyzing ions which are Rutherford-back-scattered from the sample, a three-dimensional structure including a plane of a sample element and depth can be measured in atomic unit. In a conventional Rutherford back scattering device, the ion beam diameter is large, and it is difficult to perform three-dimensional measurement in the atomic order. However, by applying the present invention, the three-dimensional measurement in the atomic order can be realized. By setting the ion beam acceleration voltage to 500 kV or higher, decreasing the beam diameter to 0.2 nm or less, irradiating a sample with the ion beam, and energy-analyzing an X ray released from the sample, two-dimensional analysis of a sample element can be performed.

The present invention discloses the following gas field ion source, an ion microscope, and an ion beam device.

(1) A gas field ion source including a vacuum vessel, an evacuation mechanism, an emitter tip as a needle-shaped anode, and an extraction electrode as a cathode, supplying a gas molecule close to the end of the emitter tip, and ionizing the gas molecule at the end of the emitter tip with an electric field, wherein a mount of the emitter tip and the extraction electrode are connected by including a shape-changeable mechanism part, and an ionization chamber in which the emitter tip is almost surrounded by at least the mount of the emitter tip, the extraction electrode, and the shape-changeable mechanism part is deformable in the vacuum vessel without hardly in contact with the vacuum vessel.

(2) The gas field ion source of (1), wherein when the gas molecule is supplied in the ionization chamber, gas pressure in the ionization chamber can be made higher than that in the vacuum chamber by at least one digit.

(3) The gas field ion source of (1), wherein the mount of the emitter tip is connected to the vacuum vessel while including another shape-changeable mechanism part.

(4) The gas field ion source of any of (1) to (3), wherein the shape-changeable mechanism part is a bellows.

(5) The gas field ion source according to (4), wherein the smallest diameter of the bellows existing between the emitter tip mount and the extraction element is smaller than the maximum diameter of the bellows existing between the emitter tip mount and the vacuum vessel.

(6) An ion beam device including: an ion beam device body including a gas field ion source having a vacuum vessel, an evacuation mechanism, in the vacuum vessel, an emitter tip as a needle-shaped anode, an extraction electrode as a cathode, a mechanism for cooling the emitter tip, and the like, supplying a gas molecule close to the end of the emitter tip, and ionizing the gas molecule at the end of the emitter tip with an electric field, a lens system for focusing an ion beam extracted from the emitter tip, a sample chamber including a sample, and a secondary particle detector for detecting secondary particles emitted from the sample; a base plate on which the ion beam device body is mounted; and a stand for supporting the base plate, wherein a vibration preventing mechanism is provided between the ion beam device body and the base plate, the cooling mechanism is supported by a floor on which the ion beam device is mounted or a supporting mechanism fixed to the ion beam device base and, further, a vibration preventing mechanism is provided between the refrigerator and the vacuum vessel.

(7) The ion beam device of (6), wherein the cooling mechanism has cold generating means which generates cold by making high-pressure gas generated by the compressor unit expand, and a refrigerator for cooling the stage by the cold of the cold generating means.

(8) The ion beam device of (6), wherein the cooling mechanism has cold generating means which generates cold by making first high-pressure gas generated by the compressor unit expand, and cooling means for cooling a member to be cooled by the gas cooled by the cold of the cold generating means.

(9) The ion beam device of (6), wherein the cooling mechanism has cold generating means which generates cold by making first high-pressure gas generated by the compressor unit expand, and cooling means for cooling a member to be cooled by a second high-pressure gas which is cooled by the cold of the cold generating means.

(10) The ion beam device of (6), wherein the vibration preventing mechanism existing between the refrigerator and the vacuum vessel includes at least a mechanism of disturbing transmission of vibration by helium or neon gas.

(11) The ion beam device of (6), wherein at least a shape-changeable mechanism part exists between the cooling stage of the cooling mechanism and an emitter tip.

(12) The ion beam device of (6), wherein the cooling mechanism is a mechanism of holding a refrigerant obtained by setting a refrigerant gas which is in a gas state at normal temperature in atmosphere into a liquid or solid state in a vacuum vessel, the vacuum vessel is connected while sandwiching at least one vibration preventing mechanism part to a vacuum vessel of the ion beam device, and a place cooled by the refrigerant and the emitter tip are connected while sandwiching at least one shape-changeable mechanism part.

(13) The gas field ion source of (12), wherein a mechanism of varying conductance to evacuate the ion chamber is a valve which can be operated from the outside of the vacuum vessel, and can be mechanically detached from a wall structure of the ionization chamber.

(14) The gas field ion source of (1), further including a resistive heater capable of heating the ionization chamber, wherein the resistive heater can be mechanically disconnected by operating at least one of a plurality of electric wires connected to the resistive heater from the outside of vacuum.

(15) The gas field ion source of (1), wherein the refrigerant of the cooling mechanism is a refrigerant obtained by setting a refrigerant gas which is in a gas state at normal temperature in atmosphere into a solid state.

(16) An ion microscope including the gas field ion source of any of (1) to (5) or (13) to (15), a lens system for focusing an ion extracted from the gas field ion source, a secondary particle detector for detecting a secondary particle, and an image display unit for displaying an ion microscope image.

The present invention discloses the following ion microscope, an ion beam device, and an ion beam inspection device.

(17) An ion beam device including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a lens and an objective lens for focusing an ion beam extracted from the emitter tip; a sample chamber housing a sample; and a secondary particle detector for detecting a secondary particle released from the sample, wherein distance from the end of the objective lens to the surface of the sample is made short to a value less than 2 mm, and the ion beam diameter is reduced to a value less than 0.2 nm.

(18) An ion microscope including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a lens system for focusing an ion beam extracted from the emitter tip; a sample chamber housing a sample; and a secondary particle detector for detecting a secondary particle released from the sample, wherein the sample chamber can be heated to about 200° C. to increase the degree of vacuum in the sample chamber to $10^{-7}$ Pa at the maximum.

(19) An ion microscope including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a lens system for focusing an ion beam extracted from the emitter tip; a sample chamber housing a sample; a secondary particle detector for detecting a secondary particle released from the sample; and a vacuum pump for evacuating the sample chamber, wherein a main vacuum pump for evacuating the sample chamber during observation by the ion microscope includes any of a sublimation pump, a non-evaporable Getter pump, an ion pump, a noble pump, and an excel pump.

(20) An ion microscope including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a vacuum pump for evacuating the gas field ion source; a lens system for focusing an ion beam extracted from the emitter tip; a sample chamber housing a sample; and a secondary particle detector for detecting a secondary particle released from the sample, wherein a main vacuum pump for evacuating the gas field ion source during observation by the ion microscope includes any of a sublimation pump, a non-evaporable Getter pump, an ion pump, a noble pump, and an excel pump.

(21) An ion microscope including: a gas field ion source having a vacuum vessel, an evacuation mechanism, in the vacuum vessel, an emitter tip as a needle-shaped anode, an extraction electrode as a cathode, a vessel of a liquid cryogen for a mechanism for cooling the emitter tip, a vacuum pump for evacuating the vessel of the liquid cryogen, and the like, supplying a gas molecule close to the end of the emitter tip, and ionizing the gas molecule at the end of the emitter tip with an electric field; a vacuum pump for evacuating the gas field ion source; a lens system for focusing an ion beam extracted from the emitter tip; a sample chamber housing a sample; and a secondary particle detector for detecting a secondary particle released from the sample, wherein a controller for controlling temperature of the vessel of the liquid cryogen by controlling operation of the vacuum pump by measurement of the degree of vacuum in the vessel of the liquid cryogen or temperature measurement is provided.

(22) An ion beam device including: a gas field ion source having a vacuum vessel, an evacuation mechanism, in the vacuum vessel, an emitter tip as a needle-shaped anode, an extraction electrode as a cathode, a vessel of a liquid cryogen for a mechanism for cooling the emitter tip, a vacuum pump for evacuating the vessel of the liquid cryogen, and the like, supplying a gas molecule close to the end of the emitter tip, and ionizing the gas molecule at the end of the emitter tip with an electric field; a lens system for focusing an ion beam extracted from the emitter tip; a sample chamber housing a sample; and a secondary particle detector for detecting a secondary particle released from the sample, wherein the cooling mechanism is a refrigerator for cooling a stage of the refrigerator by cold of cold generating means which generates cold by making high-pressure gas generated by a compressor unit expand, and sound from the compressor unit of the gas is reduced by providing the compressor unit for generating the high-pressure gas with a cover.

(23) An ion beam device including: a gas field ion source having a vacuum vessel, an evacuation mechanism, in the vacuum vessel, an emitter tip as a needle-shaped anode, an extraction electrode as a cathode, a vessel of a liquid cryogen for a mechanism for cooling the emitter tip, a vacuum pump for evacuating the vessel of the liquid cryogen, and the like, supplying a gas molecule close to the end of the emitter tip, and ionizing the gas molecule at the end of the emitter tip with an electric field; a lens system for focusing an ion beam extracted from the emitter tip; a sample stage having at least two kinds of moving mechanisms in at least two directions in a plane irradiated with an ion beam; a sample chamber housing a sample mounted on the sample stage; and a secondary particle detector for detecting a secondary particle released from the sample, wherein the sample stage is mechanically moved in two orthogonal directions, detecting secondary particles released from the sample, and obtaining an ion microscope image.

(24) The ion beam device of (23), wherein the sample stage having at least two kinds of moving mechanisms in at least two directions in a plane irradiated with the ion beam includes at least a stage using a piezo element driving mechanism, and resolution of an ion microscope image is less than 0.5 nm.

(25) An ion beam device including: a gas field ion source having a vacuum vessel, an evacuation mechanism, in the vacuum vessel, An emitter tip as a needle-shaped anode, and an extraction electrode as a cathode, a mechanism for cooling the emitter tip, a gas supply pipe, and the like, supplying a gas molecule close to the end of the emitter tip, and ionizing the gas molecule at the end of the emitter tip with an electric field; a lens system for focusing an ion beam extracted from the emitter tip; a sample chamber housing a sample; a secondary particle detector for detecting a secondary particle released from the sample; and a vacuum pump for evacuating the sample chamber; and a vacuum pump for evacuating the sample chamber, wherein a non-evaporable Getter material is mounted in a supply pipe by using an inactive gas of helium, neon, argon, krypton, xenon, or the like.

(26) An ion beam device including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a vacuum pump for evacuating the gas field ion source; a lens and an objective lens for focusing an ion beam extracted from the emitter tip; a sample chamber housing a sample; and a secondary particle detector for detecting a secondary particle released from the sample, wherein by applying high negative voltage to the emitter tip, extracting electrons from the emitter tip, irradiating a sample with the electrons, and detecting an X-ray or Auger electron emitted from the sample, an element analysis can be performed, and a scanning ion image having a resolution of 1 nm or less and an element analysis image are displayed side by side or overlappingly.

(27) An ion beam inspection device including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a vacuum pump for evacuating the gas field ion source; a lens and an objective lens for focusing an ion beam extracted from the emitter tip; and a sample chamber housing a sample, for detecting a secondary particle released from the sample and measuring a structural dimension of a sample surface, wherein voltage for acceleration an ion beam is set to 50 kV or higher, and a structural dimension on a semiconductor sample is measured.

(28) The ion beam inspection device according to (27), wherein hydrogen gas is used.

(29) An ion beam inspection device including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a vacuum pump for evacuating the gas field ion source; a lens and an objective lens for focusing an ion beam extracted from the emitter tip; and a sample chamber housing a sample, for detecting a secondary particle released from the sample and measuring a structural dimension of a sample surface, wherein energy of an ion beam is set to be less than 1 keV.

(30) An ion beam device including: a gas field ion source having a vacuum vessel, an evacuation mechanism, in the vacuum vessel, an emitter tip as a needle-shaped anode, an extraction electrode as a cathode, a mechanism for cooling the emitter tip, and the like, supplying a gas molecule close to the end of the emitter tip, and ionizing the gas molecule at the end of the emitter tip with an electric field; a vacuum pump for evacuating the gas field ion source; a lens and an objective lens for focusing an ion beam extracted from the emitter tip; a sample chamber housing a sample; and a secondary particle detector for detecting a secondary particle released from the sample, wherein a negative high voltage is applied to the emitter tip to extract electrons from the emitter tip, the electrons are allowed to pass through a composite-type objective lens obtained by combining a magnetic field lens and an electrostatic lens and are emitted to the sample, an X-ray or Auger electron released from the sample is detected, and element analysis can be performed.

(31) An element analyzing method using an ion beam device including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a lens and an objective lens for focusing an ion beam extracted from the emitter tip; a sample chamber housing a sample; and a secondary particle detector for detecting a secondary particle released from the sample, wherein acceleration voltage for an ion beam is set to 200 kV or higher, a beam diameter is reduced to 0.2 nm or less, a sample is irradiated with the resultant ion beam, ions which are Rutherford-backscattered from the sample are energy-analyzed, and a three-dimensional structure including a plane and depth of a sample element is measured in atomic unit.

(32) A sample element analyzing method using an ion beam device including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a lens and an objective lens for focusing an ion beam extracted from the emitter tip; a sample chamber housing a sample; and a secondary particle detector for detecting a secondary particle released from the sample, wherein 500 kV or higher is set, a beam diameter is reduced to 0.2 nm or less, a sample is irradiated with the resultant ion beam, an X-ray released from the sample is energy-analyzed, and a two-dimensional element analysis is performed.

(33) An ion beam device including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a lens and an objective lens for focusing an ion beam extracted from the emitter tip; a sample chamber housing a sample; and a secondary particle detector for detecting a secondary particle released from the sample, wherein the emitter tip is cooled to 50K or less, a magnification of projecting an ion released from the emitter tip onto a sample is set to be less than 0.2, and vibration of a relative position between the emitter tip and the sample is set to 0.1 nm or less, thereby setting resolution of a scanning ion image to be 0.2 nm or less.

(34) An ion beam device including: a gas field ion source having a vacuum vessel, an evacuation mechanism, in the vacuum vessel, an emitter tip as a needle-shaped anode, and an extraction electrode as a cathode, a mechanism for cooling the emitter tip, and the like, supplying a gas molecule close to the end of the emitter tip, and ionizing the gas molecule at the end of the emitter tip with an electric field; a lens and an objective lens for focusing an ion beam extracted from the emitter tip; a sample chamber housing a sample; and a secondary particle detector for detecting a secondary particle released from the sample, wherein a sample stage is of a side entry type, and has a structure whose end is in contact with a wall face of the sample chamber.

(35) An ion beam device including: a gas field ion source for generating an ion beam; an ion irradiation system for guiding the ion beam from the gas field ion source onto a sample; a vacuum vessel housing the gas field ion source and the ion irradiation system; a sample chamber housing a sample stage for holding a sample; and a cooling mechanism of a gas circulation type for cooling the gas field ion source, wherein the cooling mechanism has a refrigerator, a pipe connecting the refrigerator and the gas field ion source, a heat exchanger provided for the pipe, and a circulation compressor for circulating liquid helium in the pipe, and the pipe is fixedly supported by a floor or a supporting member.

(36) An ion beam device including: a gas field ion source for generating an ion beam; an ion irradiation system for guiding the ion beam from the gas field ion source onto a sample; a vacuum vessel housing the gas field ion source and the ion irradiation system; a sample chamber housing a sample stage for holding a sample; and a cooling mechanism for cooling the gas field ion source, wherein the cooling mechanism has cold generating means which generates cold by making first high-pressure gas generated by a compressor unit expand, and a cooling mechanism for cooling a member to be cooled by helium gas as a second movable refrigerant which is circulated by the compressor unit.

(37) An ion beam device including: a gas field ion source for generating an ion beam; an ion irradiation system for guiding the ion beam from the gas field ion source onto a sample; a vacuum vessel housing the gas field ion source and the ion irradiation system; a sample chamber housing a sample stage for holding a sample; a cooling mechanism for cooling the gas field ion source; and a base plate for supporting the field ion source, the vacuum vessel, and the sample chamber, wherein an ion beam irradiation path is provided with a magnetic shield mechanism.

(38) An ion beam device including: a gas field ion source for generating an ion beam; an ion irradiation system for guiding the ion beam from the gas field ion source onto a sample; a vacuum vessel housing the gas field ion source and the ion irradiation system; a sample chamber housing a sample stage for holding a sample; a cooling mechanism for cooling the gas field ion source; and a base plate for supporting the gas field ion source, the vacuum vessel, and the sample chamber, wherein a main material of a vacuum chamber of any of the gas field ion source, the ion beam irradiation system, and the sample chamber is iron or permalloy, and resolution of a scanning ion image is 0.5 nm or less.

Description of Reference Numerals

1 . . . gas field ion source
2 . . . ion beam irradiation system column
3 . . . sample chamber
4 . . . cooling mechanism
5 . . . condenser lens
6 . . . beam limiting aperture
7 . . . beam scanning electrode
8 . . . objective lens
9 . . . sample
10 . . . sample stage
11 . . . secondary particle detector
12 . . . ion source evacuation pump
13 . . . sample chamber evacuation pump
14 . . . ion beam
14A . . . optical axis
15 . . . ionization chamber
16 . . . compressor
17 . . . device stand
18 . . . base plate
19 . . . vibration preventing mechanism
20 . . . floor
21 . . . emitter tip
22 . . . filament
23 . . . filament mount
24 . . . extraction electrode
25 . . . gas supply pipe
26 . . . supporting rod
27 . . . hole
28 . . . side wall
29 . . . top plate
30 . . . resistive heater
31 . . . opening
32 . . . cover member
33 . . . operation rod
34 . . . cover member
40 . . . refrigerator
40A . . . center axial line
41 . . . main body
42A, 42B . . . stages 43 ... pot
46 ... helium gas
51 ... upper flange
52 ... sapphire base
53 ... cooling conduction rod
54 ... copper stranded wire
55 ... sapphire base
56 ... copper stranded wire
57 ... cooling conduction pipe
58 ... radiation shield
59 ... electrostatic lens
60 ... electrode
61, 62 ... bellows
63 ... insulating material
64 ... emitter base mount
68 ... vacuum vessel
69 ... bellows
70 ... vibration preventing mechanism
71 ... diamagnetic block 71
72 ... ring-shaped electromagnet
73 ... supporting member 73
74 ... knob
75 ... superconductor block
81 ... liquid or solid nitrogen chamber
82 ... liquid or solid nitrogen tank
83 ... evacuation port
84 ... solid nitrogen
85 ... supporting pillar
86 ... bellows
87 ... supporting pillar
91 ... field ion source controller
92 ... refrigerator controller
93 ... lens controller
94 ... beam limiting aperture controller
95 ... ion beam scanning controller
96 ... secondary particle detector controller
97 ... sample stage controller
98 ... evacuation pump controller
99 ... computer processor
101 ... surface plate
102 ... vibration preventing leg
103, 104 ... supporting pillar
133 ... electric line
134 ... power source
135 ... high-voltage power source
136 ... thin line made of stainless steel
137 ... cutting mechanism
138 ... thick line made of copper
139 ... thin line made of stainless steel
140 ... cutting mechanism
141 ... ion extraction electrode
142 ... power source
301 ... scanning deflection electrode
302 ... aperture grill
303 ... movable radiation pattern observation mechanism
304 ... secondary particle
305 ... secondary particle detector

The invention claimed is:

1. An ion beam device comprising:
a gas field ion source for generating an ion beam;
an objective lens for focusing an ion beam extracted from the gas field ion source on a sample;
a beam limiting aperture which limits an open angle of the ion beam to the objective lens;
a sample stage on which the sample is mounted; and
a vacuum vessel which includes the gas field ion source, the objective lens, the beam limiting aperture and the sample stage,
wherein the gas field ion source includes an emitter tip for generating an ion beam, an emitter base mount which supports the emitter tip, and a gas supply pipe for supplying gas to vicinity of the emitter tip, and
at least one of the vacuum pumps for evacuating a vacuum chamber housing the beam limiting aperture is a non-evaporable Getter pump.

2. The ion beam device according to claim 1, wherein molecular gas having at least two kinds of mass numbers can be irradiated, and a sample is observed by irradiating the molecular gas having smaller mass number after irradiating the molecular gas having larger mass number.

3. The ion beam device according to claim 2, wherein the degree of the vacuum in the vacuum vessel is set to $10^{-7}$Pa or less.

4. The ion beam device according to claim 3, wherein a cleaning means is provided for cleaning the beam limiting aperture by plasma.

5. An ion beam device comprising:
a gas field ion source for generating an ion beam;
an objective lens for focusing an ion beam extracted from the gas field ion source on a sample;
a movable beam limiting aperture which limits an open angle of the ion beam to the objective lens;
a sample stage on which the sample is mounted; and
a vacuum vessel which includes the gas field ion source, the objective lens, the beam limiting aperture and the sample stage,
wherein the gas field ion source includes an emitter tip for generating an ion, en emitter base mount which supports the emitter tip, and a gas supply pipe for supplying gas to vicinity of the emitter tip, and
a mechanism which produces a noncontact interaction between the emitter base mount and the vacuum vessel is provided so as to suppress fluctuations in positional relation of the emitter base mount with respect to the vacuum vessel.

* * * * *